(12) United States Patent
Mis

(10) Patent No.: US 7,358,174 B2
(45) Date of Patent: Apr. 15, 2008

(54) METHODS OF FORMING SOLDER BUMPS ON EXPOSED METAL PADS

(75) Inventor: J. Daniel Mis, Cary, NC (US)

(73) Assignee: Amkor Technology, Inc., Chandler, AZ (US)

( * ) Notice: Subject to any disclaimer, the term of this patent is extended or adjusted under 35 U.S.C. 154(b) by 72 days.

(21) Appl. No.: 11/103,690

(22) Filed: Apr. 12, 2005

(65) Prior Publication Data
US 2005/0245066 A1 Nov. 3, 2005

Related U.S. Application Data

(60) Provisional application No. 60/561,863, filed on Apr. 13, 2004.

(51) Int. Cl.
*H01L 21/44* (2006.01)
(52) U.S. Cl. ............... 438/612; 438/106; 438/618; 257/E21.021; 257/E21.168; 257/E21.174
(58) Field of Classification Search ........... 438/612, 438/106, 613, 618, 683, 685, 686, 687, 688
See application file for complete search history.

(56) References Cited

U.S. PATENT DOCUMENTS

| 162,257 | A | 11/1875 | Yung |
|---|---|---|---|
| 3,105,869 | A | 10/1963 | Branch et al. |
| 3,244,947 | A | 4/1966 | Slater |
| 3,259,814 | A | 7/1966 | Green |
| 3,274,458 | A | 9/1966 | Boyer et al. |
| 3,316,465 | A | 4/1967 | Von Bermuth et al. |
| 3,458,925 | A | 8/1969 | Napier et al. |
| 3,461,357 | A | 8/1969 | Mutter et al. |
| 3,489,965 | A | 1/1970 | Helsdon |
| 3,501,681 | A | 3/1970 | Weir |
| 3,663,184 | A | 5/1972 | Wood et al. |

(Continued)

FOREIGN PATENT DOCUMENTS

DE    42 05 029 C    2/1993

(Continued)

OTHER PUBLICATIONS

K. Yung et al; *Electroplated Solder Joints for Flip-Chip Applications*, Transactions on Components, Hybrids, and Manufacturing Technology, vol. 14 No. 3, Sep. 1991, pp. 549-559.

(Continued)

*Primary Examiner*—David Nhu
(74) *Attorney, Agent, or Firm*—Gunnison, McKay & Hodgson, L.L.P.; Serge J. Hodgson

(57) ABSTRACT

A method of forming an electronic structure may include providing a substrate having a metal pad thereon. A conductive barrier layer may be formed on a first portion of the metal pad, and a second exposed portion of the metal pad may be free of the conductive barrier layer. In addition, an interconnection structure may be provided on the conductive barrier layer with the conductive barrier layer being between the interconnection structure and the metal pad. Moreover, the interconnection structure and the conductive barrier layer may include different materials. Related structures are also discussed.

31 Claims, 8 Drawing Sheets

U.S. PATENT DOCUMENTS

| | | |
|---|---|---|
| 3,760,238 A | 9/1973 | Hamer et al. |
| 3,770,874 A | 11/1973 | Krieger et al. |
| 3,871,014 A | 3/1975 | King et al. |
| 3,871,015 A | 3/1975 | Lin et al. |
| 3,897,871 A | 8/1975 | Zimnbauer |
| 3,916,080 A | 10/1975 | Wakamastsu |
| 3,942,187 A | 3/1976 | Gelsing et al. |
| 3,959,577 A | 5/1976 | Frink |
| 3,986,255 A | 10/1976 | Mandal |
| 3,993,123 A | 11/1976 | Chu et al. |
| 4,074,342 A | 2/1978 | Honn et al. |
| 4,113,578 A | 9/1978 | Del Monte |
| 4,113,587 A | 9/1978 | Chikamori |
| 4,168,480 A | 9/1979 | De Lucia |
| 4,244,002 A | 1/1981 | Sato et al. |
| 4,257,905 A | 3/1981 | Christophorou et al. |
| 4,266,282 A | 5/1981 | Henle et al. |
| 4,273,859 A | 6/1981 | Mones et al. |
| 4,382,517 A | 5/1983 | Welsch |
| 4,449,580 A | 5/1984 | Reisman et al. |
| 4,473,263 A | 9/1984 | Sunstein |
| 4,511,873 A | 4/1985 | Baier et al. |
| 4,532,576 A | 7/1985 | Reimer |
| 4,545,610 A | 10/1985 | Lakritz et al. |
| 4,563,697 A | 1/1986 | Miura |
| 4,565,901 A | 1/1986 | Hirooka et al. |
| 4,657,146 A | 4/1987 | Walters |
| 4,661,375 A | 4/1987 | Thomas |
| 4,733,813 A | 3/1988 | Le Meau et al. |
| 4,752,027 A | 6/1988 | Oschwend |
| 4,763,829 A | 8/1988 | Sherry |
| 4,783,722 A | 11/1988 | Osaki et al. |
| 4,817,850 A | 4/1989 | Wiener-Avenear et al. |
| 4,830,264 A | 5/1989 | Bitaillou et al. |
| 4,840,302 A | 6/1989 | Gardner et al. |
| 4,855,809 A | 8/1989 | Malhi et al. |
| 4,878,611 A | 11/1989 | LoVasco et al. |
| 4,893,403 A | 1/1990 | Heflinger et al. |
| 4,897,508 A | 1/1990 | Mahulikar |
| 4,897,918 A | 2/1990 | Osaka et al. |
| 4,927,505 A | 5/1990 | Sharma et al. |
| 4,931,410 A | 6/1990 | Tokanaga et al. |
| 4,940,181 A | 7/1990 | Juskey, Jr. et al. |
| 4,948,754 A | 8/1990 | Kondo et al. |
| 4,950,623 A | 8/1990 | Dishon |
| 4,962,058 A | 10/1990 | Cronin et al. |
| 5,019,943 A | 5/1991 | Fassbender |
| 5,022,580 A | 6/1991 | Pedder |
| 5,024,372 A | 6/1991 | Altman et al. |
| 5,046,161 A | 9/1991 | Takada |
| 5,048,747 A | 9/1991 | Clark et al. |
| 5,113,314 A | 5/1992 | Wheeler et al. |
| 5,135,155 A | 8/1992 | Kang et al. |
| 5,152,451 A | 10/1992 | Derveaux et al. |
| 5,154,341 A | 10/1992 | Melton et al. |
| 5,160,409 A | 11/1992 | Moore et al. |
| 5,162,257 A | 11/1992 | Yung |
| 5,171,711 A | 12/1992 | Tobimatsu et al. |
| 5,194,137 A | 3/1993 | Moore et al. |
| 5,227,664 A | 7/1993 | Toshio |
| 5,234,149 A | 8/1993 | Katz et al. |
| 5,239,447 A | 8/1993 | Cotues et al. |
| 5,240,881 A | 8/1993 | Cayetano et al. |
| 5,250,843 A | 10/1993 | Eichelberger |
| 5,289,925 A | 3/1994 | Newmark |
| 5,293,006 A | 3/1994 | Yung |
| 5,325,265 A | 6/1994 | Turlik et al. |
| 5,327,013 A | 7/1994 | Moore et al. |
| 5,327,327 A | 7/1994 | Frew et al. |
| 5,335,795 A | 8/1994 | Chizen |
| 5,347,428 A | 9/1994 | Carson et al. |
| 5,354,711 A | 10/1994 | Heitzmann et al. |
| 5,391,514 A | 2/1995 | Gall et al. |
| 5,406,701 A | 4/1995 | Pepe et al. |
| 5,424,920 A | 6/1995 | Miyake |
| 5,432,729 A | 7/1995 | Carson et al. |
| 5,453,582 A | 9/1995 | Amano et al. |
| 5,470,787 A | 11/1995 | Greer |
| 5,475,280 A | 12/1995 | Jones et al. |
| 5,492,235 A | 2/1996 | Crafts et al. |
| 5,547,740 A | 8/1996 | Higdon et al. |
| 5,557,502 A | 9/1996 | Bannerjee et al. |
| 5,616,962 A | 4/1997 | Ishikawa et al. |
| 5,627,396 A | 5/1997 | James et al. |
| 5,634,268 A | 6/1997 | Dalal et al. |
| 5,680,296 A | 10/1997 | Hileman et al. |
| 5,736,456 A | 4/1998 | Akram |
| 5,739,053 A | 4/1998 | Kawakita et al. |
| 5,744,382 A | 4/1998 | Kitayama et al. |
| 5,751,556 A | 5/1998 | Butler et al. |
| 5,793,116 A | 8/1998 | Rinne et al. |
| 5,796,168 A | 8/1998 | Datta et al. |
| 5,812,378 A | 9/1998 | Fjelstad et al. |
| 5,851,911 A | 12/1998 | Farnworth |
| 5,886,393 A | 3/1999 | Merrill et al. |
| 5,891,756 A * | 4/1999 | Erickson ..................... 438/108 |
| 5,892,179 A | 4/1999 | Rinne et al. |
| 5,898,574 A | 4/1999 | Tan et al. |
| 5,902,686 A | 5/1999 | Mis |
| 5,923,539 A | 7/1999 | Matsui et al. |
| 5,937,320 A * | 8/1999 | Andricacos et al. ......... 438/614 |
| 5,937,329 A * | 8/1999 | Helmy et al. .................. 725/68 |
| 5,963,793 A | 10/1999 | Rinne et al. |
| 5,990,472 A | 11/1999 | Rinne |
| 6,013,572 A * | 1/2000 | Hur et al. .................... 438/614 |
| 6,133,065 A | 10/2000 | Akram |
| 6,134,120 A | 10/2000 | Baldwin |
| 6,169,325 B1 | 1/2001 | Azuma |
| 6,208,018 B1 | 3/2001 | Ma et al. |
| 6,221,682 B1 | 4/2001 | Danziger et al. |
| 6,222,279 B1 * | 4/2001 | Mis et al. .................... 257/779 |
| 6,224,690 B1 | 5/2001 | Andricacos et al. |
| 6,238,951 B1 | 5/2001 | Caillat |
| 6,332,988 B1 * | 12/2001 | Berger et al. ............... 216/100 |
| 6,335,104 B1 | 1/2002 | Sambucetti et al. |
| 6,348,401 B1 * | 2/2002 | Chen et al. .................. 438/617 |
| 6,388,203 B1 | 5/2002 | Rinne et al. |
| 6,392,163 B1 | 5/2002 | Rinne et al. |
| 6,415,974 B2 * | 7/2002 | Jao ............................ 228/215 |
| 6,418,033 B1 | 7/2002 | Rinne |
| 6,419,974 B1 | 7/2002 | Silva et al. |
| 6,501,185 B1 * | 12/2002 | Chow et al. ................ 257/780 |
| 6,541,366 B1 * | 4/2003 | Chin et al. .................. 438/613 |
| 6,622,907 B2 | 9/2003 | Fanti et al. |
| 6,762,122 B2 | 7/2004 | Mis et al. |
| 6,960,828 B2 * | 11/2005 | Nair et al. .................. 257/734 |
| 2001/0011764 A1 | 8/2001 | Elenius et al. |
| 2001/0020745 A1 | 9/2001 | Jiang et al. |
| 2002/0086520 A1 | 7/2002 | Chiang |
| 2002/0096764 A1 | 7/2002 | Huang |
| 2002/0197842 A1 | 12/2002 | Kuo et al. |
| 2003/0000738 A1 | 1/2003 | Rumsey et al. |
| 2003/0107137 A1 | 6/2003 | Stierman et al. |
| 2003/0124833 A1 | 7/2003 | Ming et al. |
| 2003/0143830 A1 | 7/2003 | Akram |

FOREIGN PATENT DOCUMENTS

| | | |
|---|---|---|
| DE | 4205029 C1 | 2/1993 |
| DE | 43 23 799 A1 | 1/1994 |
| DE | 4323799 A1 | 1/1994 |
| DE | 0 782 191 A2 | 12/1996 |
| DE | 197 41 436 | 12/1998 |
| DE | 197 41 436 A1 | 12/1998 |

| | | |
|---|---|---|
| EP | 0 355 478 | 2/1990 |
| EP | 0 603 296 | 6/1994 |
| EP | 0 603 296 B1 | 6/1994 |
| EP | 0 609 062 A1 | 8/1994 |
| EP | 0 736 972 A1 | 9/1996 |
| EP | 0 736 972 A1 | 10/1996 |
| EP | 0 782 191 A2 | 2/1997 |
| EP | 0 782 191 | 7/1997 |
| EP | 0 782 191 A2 | 7/1997 |
| EP | 0 355 478 | 4/1999 |
| EP | 1 148 548 | 10/2001 |
| FR | 2 406 893 | 5/1979 |
| FR | 2 688 628 | 9/1993 |
| FR | 2 688 628 A1 | 9/1993 |
| FR | 2 406 893 | 12/1994 |
| FR | 2 705 832 | 12/1994 |
| FR | 2 705 832 A1 | 12/1994 |
| GB | 1 288 564 | 9/1972 |
| GB | 1288564 | 9/1972 |
| GB | 2 062 963 A | 5/1981 |
| GB | 2062 963 | 5/1981 |
| GB | 2 194 387 | 3/1988 |
| GB | 2 194 387 A | 3/1988 |
| JP | 54-50269 | 4/1979 |
| JP | 54-128669 | 5/1979 |
| JP | 54-128669 | 10/1979 |
| JP | 55-111127 | 8/1980 |
| JP | 57-73952 | 5/1982 |
| JP | 57-73952 A | 5/1982 |
| JP | 55-111127 A | 8/1982 |
| JP | 57-197838 | 12/1982 |
| JP | 57-197838 A | 12/1982 |
| JP | 59-154041 | 9/1984 |
| JP | 59-154041 A | 9/1984 |
| JP | 6-116552 | 1/1986 |
| JP | 61-16552 A | 1/1986 |
| JP | 63-222445 | 9/1988 |
| JP | 63-222445 A | 9/1988 |
| JP | 4-150033 | 5/1992 |
| JP | 4-150033 A | 5/1992 |
| JP | 07066207 | 1/1994 |
| JP | 07066207 A | 3/1995 |
| JP | 63099558 | 4/1998 |
| JP | 2000 349111 | 12/2000 |
| JP | 2002 203868 | 7/2002 |
| WO | WO 93/02831 | 2/1993 |
| WO | WO 93/02831 A1 | 2/1993 |
| WO | WO 93/22475 | 11/1993 |
| WO | WO 93/22475 A1 | 11/1993 |
| WO | WO 96/30933 | 10/1996 |
| WO | WO 96/30933 A1 | 10/1996 |
| WO | WO 96/31905 | 10/1996 |
| WO | WO 96/31905 A2 | 10/1996 |
| WO | WO 98/06118 | 2/1998 |
| WO | WO 98/06118 A1 | 2/1998 |

OTHER PUBLICATIONS

E. K. Yung et al; *Flip-Chip Process Utilizing Electroplated Solder Joints*, Proceedings of the Technical Conference, 1990 International Electronics Packaging Conference, Sep. 10-12, 1990, pp. 1065-1079.

T.G. Tessier et al; *Process Considerations in Fabricating Thin Film Multi-chip Modules*, Proceedings of the Technical Conference 1989 International Electronics Packaging Conference, 1989.

PCT International Search Report dated Dec. 9, 1992 of International Appln. No. PCT/US 92/07722 filed Sep. 11, 1992.

Edelstein, D.C., et al; Derwent Publications Ltd. London, GB: AN 2002-308284 XP-002243726.

International Search Report for PCT/US 02/30697.

Jean Audel, et al; *Low Cost Bumping Process for Flip Chip*, Proc. 1995 International Flip Chip, BGA, and Ado Pkg. Symposium ITAP 95, '95 Flip Chip, BGA, TAB & AP Symposium, pp. 16-21 (1995).

M. Data, et al., *Electrochemical Fabrication of Mechanically Robust PbSn C4 Interconnections*, J. Electrochem. Soc., vol. 142, No. 11, pp. 3779-3785 (Nov. 1995).

J.D. Mis, et al; *Flip Chip Production Experience: Some Design, Process, Reliability, and Cost Considerations*, ISHM '96 Proceedings, Proc. 1996 International Symposium on Microelectronics SPIE vol. 2920, pp. 291-295 (1996).

S.K. Kang, et al; *Interfacial Reactions During Soldering With Lead-Tin Eutectic and Lead (Pb)-Free, Tin-Rich Solders*, Journal of Electronic Materials, vol. 25, No. 7, pp. 1113-1120 (1996).

Eric Jung, et al., *The Influence of NiSn Intermetallics on the Performance of Flip Chip Contacts Using a Low Cost Electroless Nickel Bumping Approach*, IEPS Proceedings of the Technical Conference, 1996 Electronics Packaging Conference, Austin, Texas, pp. 14-25 (Sep. 25-Oct. 1, 1996).

Adema et al., *Flip Chip Technology: A Method for Providing Known Good Die With High Density Interconnections*, MCM '94 Proceedings, pp. 41-49.

Datta et al., *Electrochemical Fabrication of mechanically Robust PbSn C4 Interconnections*, J. Electrochemical Society, vol. 142, No. 11, The Electrochemical Society, Inc., Nov. 1995, pp. 3779-3785.

Drake et al. "An Electrostatically Actuated Micro-Relay" Transducers '95, Eurosensors IX The 8th International Conference on Solid-State Sensors and Actuators, and Eurosensors IX pp. 380-383.

Guckel et al. "Electromagnetic Linear Actuators with Inductive Position Sensing for Micro Relay, Micro Value and Precision Positioning Applications" Transducers '95, Eurosensors IX The 8th International Conference on Solid-State Sensors and Actuators, and Eurosensors IX pp. 324-327.

Hashimoto et al. "Thermally Controlled Magnetization Microrelay" Transducers '95, Eurosensors IX The 8th International Conference on Solid-State Sensors and Actuators, and Eurosensors IX pp. 361-364.

Hirsch, *Tin-Lead, Lead and Tin Plating*, Metal Finishing Guidebook Directory 1987, 55th Guidebook-Directory Issue 1987, Mid Jan. 1987, vol. 85, No. 1A, ISSN 0026-0576, pp. 3779-3785.

Hosaka et al. Electromagnetic Microrelays: Concepts and Fundamental Characteristics, Sensors and Actuators A, 40(1994) pp. 44-47.

Howell et al: "Area Array Solder Interconnection Technology for the Three-Dimensional Silicon Cube", Proceedings of the 1995 45th Electronic Components & Technology Conferece, pp. 1174-1178.

Inaba et al. *Solder Bump Formation Using Electroless Plating and Ultrasonic Soldering*, IEEE Transactions on Components, Hybrids, and Manufacturing Technology, vol. 13, No. 1, Mar. 1990, pp. 119-123.

Knüppel "Rugged Design for Reliable Switching: Micro a Relay Sets New Automotive Standards" Components XXIX (1994) No. 4 pp. 30-32.

Lineback, "3D IC Packaging Moves Closer to Commercial Use", Electronic World News, May 21, 1990, p. 15.

Multimedia Card Association, www.mmca.org.

PCB Assembly, *Electronic Packaging & Production*, vol. 35, No. 1, p. 40 (Jan. 1995).

SanDisk Corporation, SanDisk Flash Data Storage, San Disk Compact Flash™ and MultiMedia Card: Small Form Factor Solutions, 1999.

Specificaiton Sheet, NaiS, *Ultra Low Profile 2 Amp-Polarized Relay*, TK-Relays.

"Promoting Worldwide Adoption of the MultiMediaCard Standard" *MultiMediaCard Association* 1 page <http://www.mmca.org> accessed on Nov. 9, 2000.

"SanDisk CompactFlash and MultiMediaCard: Small Form Factor Solutions" brochure 6 pages (1999).

Adema et al. "Flip Chip technology: A Method for Providing Known Good Die with High Density Interconnections" *MCM '94 Proceedings* pp. 41-49 (1994).

Audet et al. "Low Cost Bumping Process for Flip Chip" *Proceedings of the 1995 Flip Chip, BGA, TAB & AP Symposium* pp. 16-21 (1995).

Datta et al. "Electrochemical Fabrication of Mechanically Robust PbSn C4 Interconnections" *J. Electrochem Soc* 142(11): 3779-3785 (1995).

Datta et al. "Electrochemical Fabrication of Mechanically Robust PbSn C4 Interconnections" *Journal of the Electrochemical Society* 142(11): 3779-3785 (1995).

Drake et al. "An Electrostatically Actuated Micro-Relay" *The 8th International Conference on Solid-State Sensors and Actuators and Eurosensors IX*, Stockholm, Sweden 2: 380-383 (1995).

Guckel et al. "Electromagnetic Linear Actuators with Inductive Position Sensing for Micro Relay, Micro Valve and Precision Positioning Applications" *The 8th International Conference on Solid-State Sensors and Actuators and Eurosensors IX*, Stockholm, Sweden 1: 324-327 (1995).

Hashimoto et al. "Thermally Controlled Magnetization Microrelay" *The 8th International Conference on Solid-State Sensors and Actuators and Eurosensors IX*, Stockholm, Sweden 1: 361-364 (1995).

Hirsch "Tin-Lead and Tin Plating" *Metal Finishing Guidebook Directory 1987* pp. 280-287 (1987).

Hosaka et al. "Electromagnetic Microrelays: Concepts and Fundamental Characteristics" *Sensors and Actuators* 40: 41-47 (1994).

Howell et al. "Area Array Solder Interconnection Technology for the Three-Dimensional Silicon Cube" IEEE 49th Electronic Components & Technology Conference pp. 1174-1178 (1999).

Inaba et al. "Solder Bump Formation Using Electroless Plating and Ultrasonic Soldering" *IEEE Transactions on Components, Hybrids, and Manufacturing Technology* 13(1): 119-123 (1990).

International Search Report for application No. PCT/US1992/07722 mailed on Dec. 18, 1992.

International Search Report for application No. PCT/US2002/03697 mailed on Jun. 24, 2003.

Jung et al. "The Influence of NiSn Intermetallics on the Performance of Flip Chip Contacts Using a Low Cost Electronless nickel Bumping Approach" *IEPS Proceedings of the Technical Conference; 1996 Electronics Packaging Conference* pp. 14-25 (1996).

Kang et al. "Interfacial Reactions during Soldering with lead-Tin Eutectiv and Lead (Pb)-Free, Tin-Rich Solders" *Journal of electronic Materials* 25(7): 1113-1117 (1996).

Knuppel "Rugged Design for Reliable Switching: Micro A Relay Sets New Automotive Standards" *Componets* 29(4): 30-32 (1994).

Lineback "3D IC Packaging Moves Closer to Commercial Use" *Electronic World News* May 21, 1990 p. 15.

Mis et al. "Flip Chip Production Experience: Some Design, Process, Reliability and Cost Considerations" *International Symposium on Microelectronics* 2920: 291-295 (1996).

Nais "Ultra Low Profile 2 Amp Polarized Relay" brochure 5 pages.

Swanson, ed. "Assembly Technology in China" *Electronic Packaging & Production* 35(1): 40, 42 (1995).

Tessier et al. "Process Considerations in Fabricating Thin Film Multichip Modules" IEEE Press (1992).

Translation of the Official Action for Japanese patent application No. 138944/1997 on Dec. 24, 1998.

XP-002243726.

Yung et al. "Electroplated Solder joints for Flip=Chip Applications" *IEEE Transactions on Componets, Hybrids, and Manufacturing Technology* 14(3): 549-559 (1991).

Yung et al. "Flip-Chip Process Utilizing Electroplated Solder Joints" *IEPS Proceedings of the Technical Conference* Sep. 10-12, 1990 pp. 1065-1079 (1990).

Partial International Search Report for International application No. PCT/US2005/012029 mailed on Jul. 26, 2005.

Invitation to Pay Additional Fees and Partial International Search Report for International patent application No. PCT/US2005/012029 mailed on Jul. 26, 2005.

Arai et al. "Sn-Ag Solder Bump Formation for Flip-Chip Bonding by Electroplating" *Journal of the Electrochemical Society* 150(10): C730-C734 (2003).

Chan et al. "Investigation of Cr/Cu/Cu/Ni Under Bump Metallization for Lead-free Application" *IEEE 2002 Electronics Packaging Technology Conference* pp. 270-275 (2002).

Ezawa et al. "Eutectic Sn-Ag Solder Bump Process for ULSI Flip Chip Technology" *IEEE Transactions on Electronics Packaging Manufacturing* 24(4): 275-281 (Oct. 2001).

International Search Report and Written Opinion of the International Searching Authority for International patent application No. PCT/US2005/012029 mailed on Oct. 28, 2005.

International Search Report and Written Opinion of the International Searching Authority for International patent application No. PCT/US2005/023041 mailed on Oct. 11, 2005.

Kim et al. "Electrodeposition of Near-Eutectic SnAg Solders for Wafer-Level Packaging" *Journal of the Electrochemical Society* 150(9): C577-C584 (2003).

Kiumi et al. "Processing, Propeties, and reliability of Electroplated Lead-Free Solder Bumps" *IEEE Inter Society Conference on Thermal Phenomena* pp. 909-912 (2002).

\* cited by examiner

METHODS OF FORMING SOLDER BUMPS ON EXPOSED METAL PADS

RELATED APPLICATION

This application claims the benefit of priority from U.S. Provisional Patent Application No. 60/561,863 filed on Apr. 13, 2004, the disclosure of which is hereby incorporated herein by reference in its entirety.

FIELD OF THE INVENTION

The present application relates to the field of electronics, and more particularly, to methods of forming interconnection bumps and related structures.

BACKGROUND OF THE INVENTION

C4 (Controlled-Collapse Chip Connection) is used to connect IC (integrated circuit) chips to substrates in electronic packages. Moreover, C4 is a flip-chip technology in which the interconnections may be provided using relatively small solder balls on the chip surface. Because it is an area array, C4 technology may provide relatively high densities for chip interconnections.

C4 technology has been used since the 1960s and has proven reliable in the semiconductor field. Historically, PbSn (lead-tin) solder has been evaporated through a metal mask. In the 1990s, electrochemical fabrication of C4 interconnections was introduced. See, for example, M. Datta, et al., "Electrochemical Fabrication of Mechanically Robust PbSn Interconnections", J. Electrochem. Soc., 142, 3779 (1995), U.S. Pat. No. 5,162,257 to Yung, and WO 96/30933, the disclosures of which are hereby incorporated herein in their entirety by reference. Electroplating may be more extendible than evaporation to small C4-pad dimensions, and may provide closer pad spacing, larger wafers, and/or lower-melting solders (having a higher content of Sn).

U.S. Pat. No. 5,937,320 discusses barrier layers for electroplated PbSn eutectic solder joints. An electrochemically fabricated C4 interconnection may have a barrier layer between the electroplated tin-rich solder bump and the ball-limiting metallurgy that protects the terminal metal in the ball-limiting metallurgy from attack by the Sn in the solder. The barrier layer may be electroplated through the same photoresist mask as the solder and thus may not require a separate patterning step. A thin layer of electroplated nickel may serve as a reliable barrier layer between a copper-based ball-limiting metallurgy and a tin-lead (PbSn) eutectic C4 ball. U.S. Pat. No. 6,622,907 discusses a sacrificial seed layer process for forming C4 solder balls. The disclosures of U.S. Pat. Nos. 5,937,320 and 6,622,907 are hereby incorporated herein in their entirety by reference.

SUMMARY

According to embodiments of the present invention, methods of forming an electronic structure may include providing a substrate having a metal pad thereon. A conductive barrier layer may be formed on a first portion of the metal pad with a second exposed portion of the metal pad remaining free of the conductive barrier layer. In addition, an interconnection structure may be provided on the conductive barrier layer so that the conductive barrier layer is between the interconnection structure and the metal pad and so that the interconnection structure and the conductive barrier layer include different materials.

More particularly, forming the conductive barrier layer may include forming a conductive seed layer on the metal pad and on the substrate. The conductive barrier layer may be selectively formed on a portion of the conductive seed layer on the first portion of the metal pad so that a second portion of the seed layer on the second portion of the metal pad is free of the conductive barrier layer. The second portion of the seed layer may then be removed from the second portion of the metal pad after selectively forming the conductive barrier layer. Moreover, removing the second portion of the seed layer may include etching the second portion of the seed layer using an etch chemistry that etches at least a portion of the conductive seed layer preferentially with respect to the conductive barrier layer and the metal pad.

The exposed second portion of the metal pad may surround the conductive barrier layer, or a portion of the conductive barrier layer may extend beyond an edge of the metal pad. In addition, an insulating passivation layer may be formed on the substrate surrounding the metal pad, with the insulating passivation layer extending on an edge portion of the metal pad so that the second portion of the metal pad is exposed between the conductive barrier layer and the insulating passivation layer. A portion of the conductive barrier layer may also extend on a portion of the insulating passivation layer. In addition or in alternatives, a center of the conductive barrier layer may be substantially aligned with respect to a center of the metal pad, or a center of the conductive barrier layer may be substantially offset with respect to a center of the metal pad.

A second metal pad may also be provided on the substrate, and the first and second metal pads may be spaced apart. A second conductive barrier layer may also be formed on a portion of the second metal pad, and an alignment of the first conductive barrier layer relative to the first metal pad may be different than an alignment of the second conductive barrier layer relative to the second metal pad. For example, the first conductive barrier layer may be substantially aligned relative to the first metal pad, and the second conductive barrier layer may be substantially offset relative to the second metal pad. In an alternative, the first conductive barrier layer may be substantially offset in a first direction relative to the first metal pad, and the second conductive barrier layer may be substantially offset in a second direction relative to the second metal pad, and the first and second directions may be different.

The interconnection structure may include a solder bump and/or a copper post. In addition, the metal pad may include aluminum, copper, gold, and/or alloys thereof, the conductive barrier layer may include nickel, copper, and/or alloys thereof, and the interconnection structure may include solder and/or copper. The metal pad may include aluminum, and the conductive barrier layer may include nickel.

According to additional embodiments of the present invention, an electronic structure may include a substrate having a metal pad thereon. A conductive barrier layer may be on a first portion of the metal pad with a second exposed portion of the metal pad being free of the conductive barrier layer. An interconnection structure may be provided on the conductive barrier layer so that the conductive barrier layer is between the interconnection structure and the metal pad and so that the interconnection structure and the conductive barrier layer include different materials.

For example, the exposed second portion of the metal pad may surround the conductive barrier layer, or a portion of the conductive barrier layer may extend beyond an edge of the metal pad. In addition, an insulating passivation layer on the substrate may surround the metal pad, and the insulating passivation layer may extend on an edge portion of the metal pad so that the second portion of the metal pad is exposed between the conductive barrier layer and the insulating passivation layer. Moreover, a portion of the conductive barrier layer may extend on a portion of the insulating passivation layer. A center of the conductive barrier layer may be substantially aligned with respect to a center of the metal pad, or a center of the conductive barrier layer may be substantially offset with respect to a center of the metal pad.

In addition, a second metal pad may be provided on the substrate with the first and second metal pads being spaced apart, and a second conductive barrier layer may be provided on a portion of the second metal pad. More particularly, an alignment of the first conductive barrier layer relative to the first metal pad may be different than an alignment of the second conductive barrier layer relative to the second metal pad. The first conductive barrier layer may be substantially aligned relative to the first metal pad, and the second conductive barrier layer may be substantially offset relative to the second metal pad. In an alternative, the first conductive barrier layer may be substantially offset in a first direction relative to the first metal pad, and the second conductive barrier layer may be substantially offset in a second direction relative to the second metal pad with the first and second directions being different.

The interconnection structure may include a solder bump and/or a copper post, and a seed layer may be provided between the conductive barrier layer and the metal pad, with the seed layer and the conductive barrier layer including different materials. The metal pad may include aluminum, copper, gold, and/or alloys thereof; the conductive barrier layer may include nickel, copper, and/or alloys thereof; and the interconnection structure may include solder and/or copper. More particularly, the metal pad may include aluminum and the conductive barrier layer may include nickel.

According to still additional embodiments of the present invention, methods of forming an electronic structure may include providing a substrate having a metal pad thereon. An underbump metallurgy layer may be formed on a surface of the metal pad with the metal pad being between the underbump metallurgy layer and the substrate. A barrier layer may be formed on the underbump metallurgy layer with the underbump metallurgy layer being between the barrier layer and the metal pad. Moreover, an entirety of the barrier layer may be conformal with respect to the surface of the metal pad, and the barrier layer and the underbump metallurgy layers may include different materials. In addition, a solder bump may be formed on the barrier layer with the barrier layer being between the solder bump and the underbump metallurgy layer, and the barrier layer and the solder bump may include different materials.

According to yet additional embodiments of the present invention, methods of forming an electronic structure may include providing a substrate having a metal pad thereon. An underbump metallurgy layer may be formed on a surface of the metal pad with the metal pad being between the underbump metallurgy layer and the substrate. A barrier layer may be formed on the underbump metallurgy layer with the underbump metallurgy layer being between the barrier layer and the metal pad, and the barrier layer and the underbump metallurgy layer may include different materials. Moreover, a solder bump may be formed on the barrier layer with the barrier layer being between the solder bump and the underbump metallurgy layer. The barrier layer and the solder bump may include different materials, and a portion of the metal pad may be exposed adjacent to the underbump metallurgy layer, the barrier layer, and the solder bump.

According to more embodiments of the present invention, an electronic structure may include a substrate having a metal pad thereon and an underbump metallurgy layer on a surface of the metal pad with the metal pad being between the underbump metallurgy layer and the substrate. A barrier layer may be provided on the underbump metallurgy layer with the underbump metallurgy layer being between the barrier layer and the metal pad. Moreover, an entirety of the barrier layer may be conformal with respect to the surface of the metal pad, and the barrier layer and the underbump metallurgy layers may include different materials. In addition, a solder bump may be provided on the barrier layer with the barrier layer being between the solder bump and the underbump metallurgy layer, and the barrier layer and the solder bump may include different materials.

According to still more embodiments of the present invention, an electronic structure may include a substrate having a metal pad thereon and an underbump metallurgy layer on a surface of the metal pad with the metal pad being between the underbump metallurgy layer and the substrate. A barrier layer may be provided on the underbump metallurgy layer with the underbump metallurgy layer being between the barrier layer and the metal pad, and the barrier layer and the underbump metallurgy layer may include different materials. In addition, a solder bump may be provided on the barrier layer with the barrier layer being between the solder bump and the underbump metallurgy layer. The barrier layer and the solder bump may include different materials, and a portion of the metal pad may be exposed adjacent to the underbump metallurgy layer, the barrier layer, and the solder bump.

DETAILED DESCRIPTION

Figure 1A:
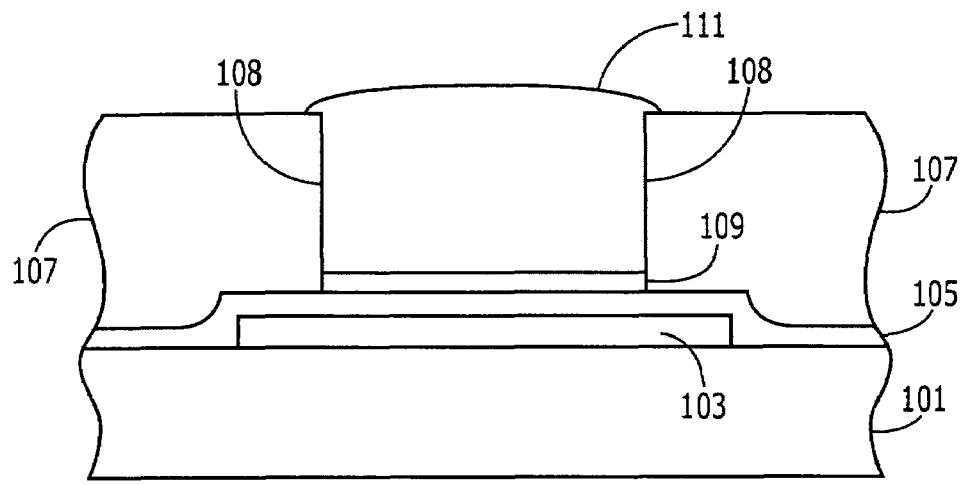
FIGS. 1A-1C are cross-sectional views illustrating steps of forming electronic structures according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. Similarly, when an element such as a layer, region or substrate is referred to as being coupled or connected to/with another element, it can be directly coupled or connected to/with the other element or intervening elements may also be present. In contrast, if an element such as a layer, region or substrate is referred to as being directly coupled or connected to/with another element, then no other intervening elements are present. As used herein, the term "and/or" includes any and all combinations of one or more of the associated listed items. The symbol "/" is also used as a shorthand notation for "and/or".

Furthermore, relative terms, such as beneath, upper, lower, top, and/or bottom may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "laterally" refers to a direction parallel to a surface of a substrate or die on which solder has been plated.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When forming a solder bump on an existing device (input/output) pad, the device (input/output) pad may be sealed with an underbump metallurgy and/or passivation layer so that portions of the device pad are protected from the solder bump and/or from the environment. Such a structure, however, may result in a solder bump with a dimension larger than an exposed portion of the device pad. Accordingly, shorts between adjacent solder bumps may occur during reflow if the solder bumps extend laterally taking on a super-hemispheric profile.

A size of an exposed portion of an input/output pad may be reduced by forming and patterning an additional passivation layer thereon. In an alternative, an input/output pad may be reconfigured using a redistribution layer. Use of an additional passivation layer and/or a redistribution layer, however, may increase cost and/or complexity.

Methods and structures according to some embodiments of the present invention may provide a solder bump with dimensions smaller than an exposed portion of the device pad on which the solder bump is formed. Accordingly, bumping on tighter pitch designs may be provided without requiring forming an additional passivation layer on the device pad before bumping.

Figure 1B:
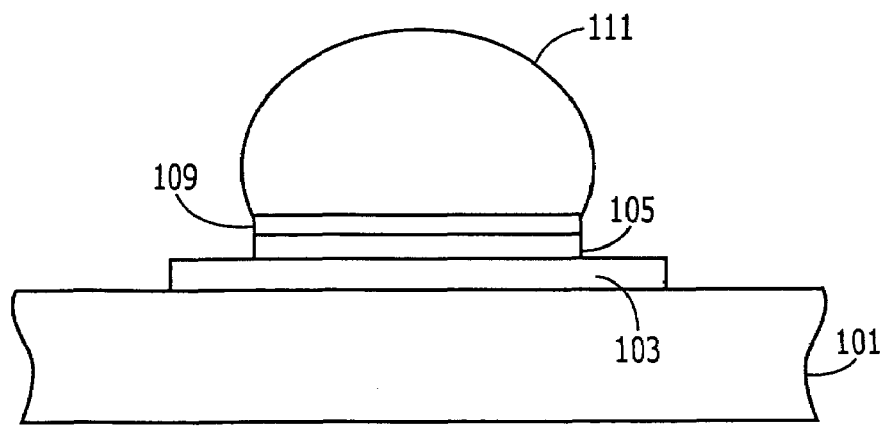

According to first embodiments of the present invention illustrated in the cross-sectional views of FIGS. 1A and 1B, a substrate 101 may be provided with a metal pad 103 thereon wherein the metal pad 103 is free of any passivation layer thereon. The substrate 101 may be an integrated circuit substrate including integrated circuit devices therein, and the metal pad 103 may provide electrical connection with integrated circuit devices of the substrate 101. More particularly, an exposed surface of the metal pad 103 may comprise aluminum, gold, copper, and/or alloys thereof.

An underbump metallurgy (seed) layer 105 may then be formed on the metal pad 103 and on the substrate 101 to facilitate subsequent electroplating. The underbump metallurgy (seed) layer 105 may include an adhesion layer adjacent the substrate 101 and metal pad 103 and a conduction layer on the adhesion layer opposite the substrate 101 and metal pad 103. More particularly, the adhesion layer may include titanium-tungsten (TiW), and the conduction layer may include copper (Cu), Silver (Ag), gold (Au), Palladium (Pd), and/or alloys thereof. The underbump metallurgy (seed) layer 105 may also include an intermediate layer between adhesion and conduction layers, and the intermediate layer may include titanium (Ti) and/or titanium nitride (TiN).

A plating stencil (mask) 107 is then formed on the underbump metallurgy (seed) layer 105, and a hole 108 in the plating stencil 107 exposes portions of the underbump metallurgy (seed) layer 105. More particularly, the hole 108 exposes an area of the underbump metallurgy (seed) layer 105 that is less than an area of the metal pad 103 so that portions of the metal pad 103 extend beyond boundaries of the hole 108 as shown in FIG. 1A. The plating stencil (mask) 107, for example, may be a layer of an organic or inorganic photo-imagable material such as photoresist, and the hole may be formed using photolithography. More particularly, the plating stencil (mask) 107 may be formed by spinning or laminating the material on the underbump metallurgy (seed) layer 105, baking the material, selectively exposing the material to radiation (such as light), and developing the material to form the hole 108. In addition or in an alternative, the plating stencil (mask) 107 may be formed using electro-deposition.

A barrier layer 109 may then be selectively formed (such as by plating) on portions of the underbump metallurgy (seed) layer 105 exposed through the hole 108. The barrier layer 109, for example, may include nickel, copper, and/or alloys thereof After plating the barrier layer 109, a solder bump 111 is plated in the hole 108 on the barrier layer 109. The solder bump 111 may include an alloy such as a tin-lead (SnPb) solder, or the solder bump 111 may be lead free.

Once the barrier layer 109 and the solder bump 111 are plated, the plating stencil (mask) 107 can be removed as shown in FIG. 1B. As further shown in FIG. 1B, portions of the underbump metallurgy (seed) layer 105 not covered by the barrier layer 109 and/or solder bump 111 may be removed, and the solder bump 111 may be subjected to reflow to provide a solder ball. For example, exposed portions of the underbump metallurgy (seed) layer 105 may be removed using an etch chemistry that removes the underbump metallurgy (seed) layer selectively with respect to the barrier layer 109. Accordingly, the patterned underbump metallurgy (seed) layer 105 may be undercut with respect to the barrier layer 109.

More particularly, the underbump metallurgy (seed) layer 105 may be removed using an etch chemistry that removes at least a remaining portion of the underbump metallurgy (seed) layer 105 selectively with respect to the metal pad 103. For example, peroxide ($H_2O_2$) may be used to remove a TiW adhesion layer of the underbump metallurgy (seed) layer 105 selectively with respect to an aluminum (or other) pad metal 103. Reflow of the solder bump 111 may be performed after removing a solder wettable conduction layer of the underbump metallurgy (seed) layer 105 but before removing a solder non-wettable adhesion layer of the underbump metallurgy (seed) layer 105 so that the solder bump 111 does not spread across exposed portions of the metal pad 103.

In an alternative, the metal pad 103 may include a solder non-wettable metal (such as aluminum) on a surface thereof so that reflow of the solder bump 111 may be performed after removing the underbump metallurgy (seed) layer 105 without the solder bump 111 spreading across exposed portions of the metal pad 103. In another alternative, reflow of the solder bump 111 may be performed without flux to maintain an oxide thereon so that the solder bump 111 does not spread across an exposed wettable surface such as a conduction layer of the underbump metallurgy (seed) layer 105 (before removing exposed portions of the underbump metallurgy layer) or the metal pad 103 (after removing exposed portions of the underbump metallurgy layer). Reflow of the solder bump 111 may be performed above a liquidus temperature of the solder bump 111, or reflow of the solder bump 111 may not exceed a liquidus temperature of the solder bump 111. In yet another alternative, the solder bump 111 may not be subjected to reflow.

As shown in FIG. 1B, central portions of the metal pad 103 may be covered by the remaining portions of the underbump metallurgy (seed) layer 105, the barrier layer 109, and the solder bump 111. Edge portions of the metal pad 103, however, may remain exposed after forming the barrier layer 109 and the solder bump 111, and/or after reflowing the solder bump 111.

As further shown in FIGS. 1A and 1B, the metal pad 103 may be considered to be "above" a surface of the substrate because an entirety of the metal pad 103 may be exposed before forming the underbump metallurgy (seed) layer 105, the barrier layer 109, and the solder bump 111. Accordingly, a surface portion of the substrate 101 may include an insulating passivation layer, and a hole and/or conductive via through the passivation layer may provide electrical coupling between the metal pad 103 and an electronic circuit(s) of the substrate 101. According to some embodiments shown in FIG. 1B, an entirety of the patterned underbump metallurgy (seed) layer 105 and an entirety of the barrier layer 109 may be conformal with respect to the metal pad 103 such that neither extends beyond an edge of the metal pad. According to other embodiments shown in the cross-sectional views of FIGS. 1B and 1C, portions of the patterned underbump metallurgy (seed) layer 105 and the barrier layer 109 (shown in the cross-sectional view of FIG. 1C) may extend beyond edges of the metal pad 103 while other portions of the patterned underbump metallurgy (seed) layer and barrier layer (shown in the cross-sectional view of FIG. 1B) are set back from edges of the metal pad.

Figure 1C:
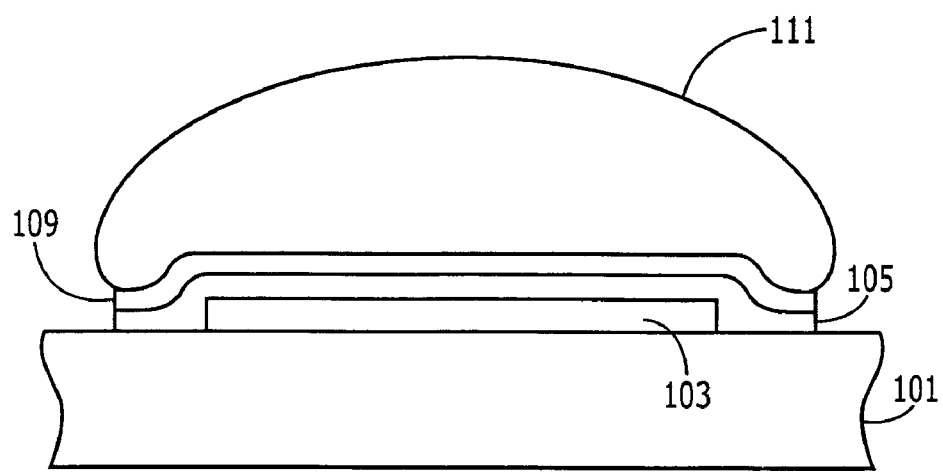
Figure 5:
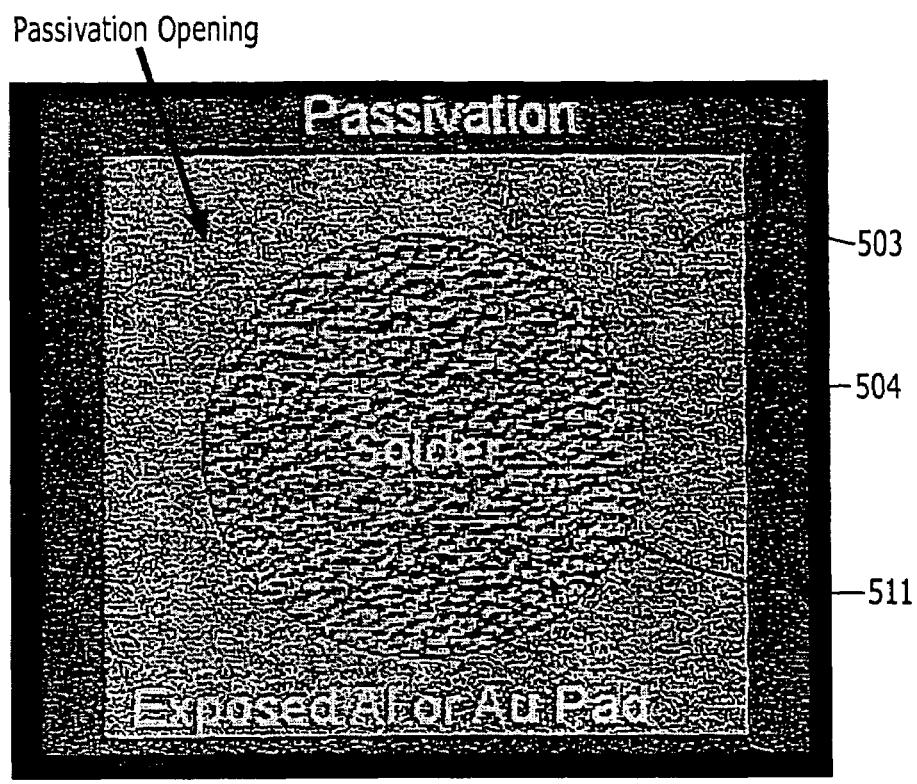
FIGS. 5, 6, and 7 are plan views of electronic structures according to embodiments of the present invention.

If the metal pad 103 is square and each of the patterned underbump metallurgy layer 105, the barrier layer 109, and the solder bump 111 are maintained within the metal pad 103, the solder bump 111. may have a circular footprint as shown, for example, in FIG. 5. In other embodiments, FIG. 1C may be a cross-sectional view taken at an angle with respect to the cross-section of FIG. 1B. As shown in FIG. 1C, portions of the patterned underbump metallurgy (seed) layer 105, the barrier layer 109, and the solder bump 111 may extend beyond the metal pad 103 onto the substrate 101. If the metal pad 103 is square when viewed from the top, and the cross-sections of FIGS. 1B and 1C are at an angle of 45 degrees with respect to each other, the solder bump 111 may have a circular footprint as shown, for example, in FIG. 6. If the metal pad 103 is square when viewed from the top, and the cross-sections of FIGS. 1B and 1C are at an angle of 90 degrees with respect to each other, the solder bump 111 may have an oval footprint as shown, for example in FIG. 7.

In alternatives, the underbump metallurgy (seed) layer 105 may be patterned using the barrier layer 109 without the solder bump 111. The barrier layer 109, for example, may be selectively formed (such as by plating) on the underbump metallurgy (seed) layer 105, and portions of the underbump metallurgy (seed) layer 105 exposed by the barrier layer 109 may be selectively removed. After exposed portions of the underbump metallurgy (seed) layer 105 have been selectively removed, a solder bump or other interconnection structure may be provided on the barrier layer 109. For example, a solid preformed solder structure may be placed on the barrier layer 109, and/or the barrier layer 109 may be bonded with a solder structure on a second substrate.

In addition or in an alternative, a conductive post (such as a copper post) may be provided on the barrier layer 109 instead of the solder bump 111 or between the barrier layer 109 and the solder bump 111. A conductive post may be selectively formed on the barrier layer 109 (such as by plating using plating stencil 107) before selectively removing exposed portions of the underbump metallurgy (seed) layer 105, and/or a conductive post may be placed on the barrier layer 109 after selectively removing exposed portions of the underbump metallurgy (seed) layer 105. A solder structure may then be formed on the conductive post, and/or a solid preformed solder structure may be placed on the conductive post. In an alternative, the conductive post may be bonded with a solder structure on a second substrate.

Figure 2A:
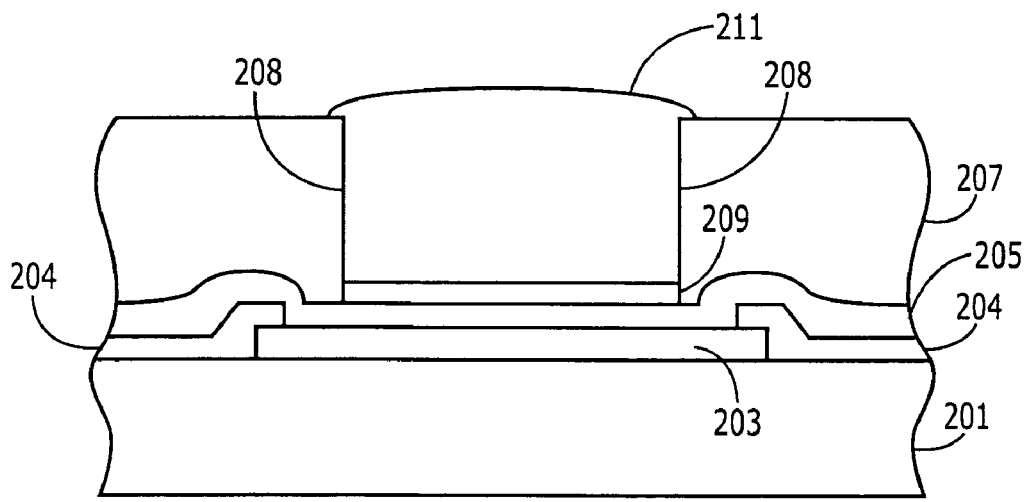
FIGS. 2A-2C are cross-sectional views illustrating steps of forming electronic structures according to additional embodiments of the present invention.
Figure 2B:
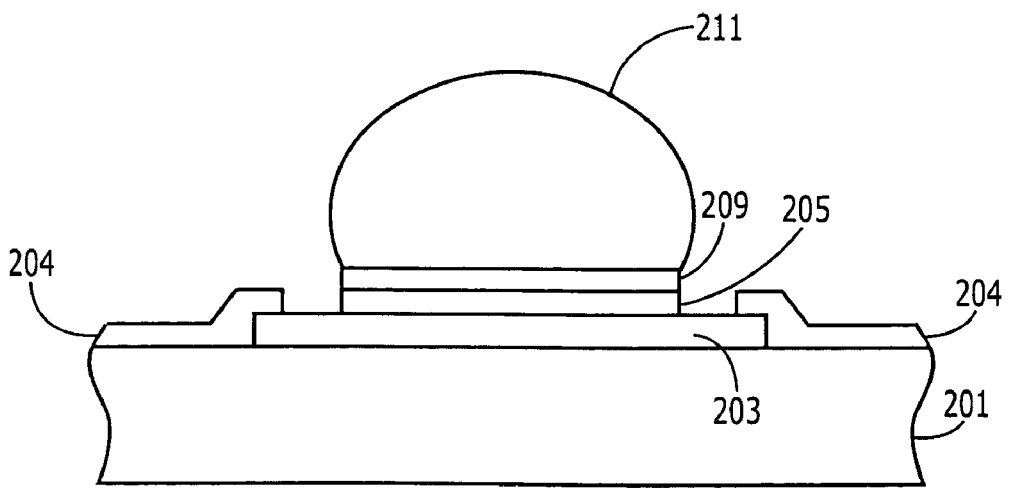

According to second embodiments of the present invention illustrated in the cross-sectional views of FIGS. 2A and 2B, a substrate 201 may be provided with a metal pad 203 and an inorganic dielectric passivation layer 204 (such as silicon oxide layer) thereon. For example, the inorganic passivation layer 204 may be formed over the substrate 201 and the metal pad 203 and then patterned to expose portions of the metal pad 203. The substrate 201 may be an integrated circuit substrate including integrated circuit devices therein, and the metal pad 203 may provide electrical connection with integrated circuit devices of the substrate 201. More particularly, an exposed surface of the metal pad 203 may comprise aluminum, gold, copper, and/or alloys thereof.

An underbump metallurgy (seed) layer 205 may then be formed on the metal pad 203 and on the inorganic passivation layer 204 to facilitate subsequent electroplating. The underbump metallurgy (seed) layer 205 may include an adhesion layer adjacent the passivation layer 204 and metal pad 203 and a conduction layer on the adhesion layer opposite the passivation layer 204 and metal pad 203. More particularly, the adhesion layer may include titanium-tungsten (TiW), and the conduction layer may include copper (Cu), Silver (Ag), gold (Au), Palladium (Pd), and/or alloys thereof. The underbump metallurgy (seed) layer 205 may also include an intermediate layer between adhesion and conduction layers, and the intermediate layer may include titanium (Ti) and/or titanium nitride (TiN).

A plating stencil (mask) 207 is then formed on the underbump metallurgy (seed) layer 205, and a hole 208 in the plating stencil 207 exposes portions of the underbump metallurgy (seed) layer 205. More particularly, the hole 208 exposes an area of the underbump metallurgy (seed) layer 205 that is less than an area of the metal pad 203 exposed by the passivation layer 204 so that portions of the metal pad 203 exposed by the passivation layer 204 extend beyond boundaries of the hole 208 as shown in FIG. 2A. The plating stencil (mask) 207, for example, may be a layer of an organic or inorganic photo-imagable material such as photoresist, and the hole may be formed using photolithography. More particularly, the plating stencil (mask) 207 may be formed by spinning or laminating the material on the underbump metallurgy (seed) layer 205, baking the material, selectively exposing the material to radiation (such as light), and developing the material to form the hole 208. In addition or in an alternative, the plating stencil (mask) 207 may be formed using electro-deposition.

A barrier layer 209 may then selectively formed (such as by plating) on portions of the underbump metallurgy (seed) layer 205 exposed through the hole 208. The barrier layer 209, for example, may include nickel, copper, and/or alloys thereof. After plating the barrier layer 209, a solder bump 211 is plated in the hole 208 on the barrier layer 209. The solder bump 211 may include an alloy such as a tin-lead (SnPb) solder, or the solder bump 211 may be lead free.

Once the barrier layer 209 and the solder bump 211 are plated, the plating stencil (mask) 207 can be removed as shown in FIG. 2B. As further shown in FIG. 2B, portions of the underbump metallurgy (seed) layer 205 not covered by the barrier layer 209 and/or solder bump 211 may be removed, and the solder bump 211 may be subjected to reflow to provide a solder ball. For example, exposed portions of the underbump metallurgy (seed) layer 205 may be removed using an etch chemistry that removes the underbump metallurgy (seed) layer selectively with respect to the barrier layer 209. Accordingly, the patterned underbump metallurgy (seed) layer 205 may be undercut with respect to the barrier layer 209.

More particularly, the underbump metallurgy (seed) layer 205 may be removed using an etch chemistry that removes at least a remaining portion of the underbump metallurgy (seed) layer 205 selectively with respect to the metal pad 203. For example, peroxide ($H_2O_2$) may be used to remove a TiW adhesion layer of the underbump metallurgy (seed) layer 205 selectively with respect to an aluminum (or other) pad metal 203. Reflow of the solder bump 211 may be performed after removing a solder wettable conduction layer of the underbump metallurgy (seed) layer 205 but before removing a solder non-wettable adhesion layer of the underbump metallurgy (seed) layer 205 so that the solder bump 211 does not spread across exposed portions of the metal pad 203.

In an alternative, the metal pad 203 may include a solder non-wettable metal (such as aluminum) on a surface thereof so that reflow of the solder bump 211 may be performed after removing the underbump metallurgy (seed) layer 205 without the solder bump 211 spreading across exposed portions of the metal pad 203. In another alternative, reflow of the solder bump 211 may be performed without flux to maintain an oxide thereon so that the solder bump 211 does not spread across an exposed wettable surface such as a conduction layer of the underbump metallurgy (seed) layer 205 (before removing exposed portions of the underbump metallurgy layer) or the metal pad 203 (after removing exposed portions of the underbump metallurgy layer). Reflow of the solder bump 211 may be performed above a liquidus temperature of the solder bump 211, or reflow of the solder bump 211 may not exceed a liquidus temperature of the solder bump 211. In yet another alternative, the solder bump 211 may not be subjected to reflow.

As shown in FIG. 2B, edge portions of the metal pad 203 may be covered by the passivation layer 204, and central portions of the metal pad 203 may be covered by the remaining portions of the underbump metallurgy (seed) layer 205, the barrier layer 209, and the solder bump 211. Portions of the metal pad 203 between the passivation layer 204 and the patterned underbump metallurgy layer 205, however, may remain exposed after forming the barrier layer 209 and the solder bump 211, and/or after reflowing the solder bump 211.

As further shown in FIGS. 2A and 2B, the metal pad 203 may be considered to be "below" or "beneath" a surface of the substrate because portions of the metal pad 203 may be covered by the passivation layer 204 before forming the underbump metallurgy (seed) layer 205, the barrier layer 209, and the solder bump 211. Stated in other words, the passivation layer 204 may be considered as a part of the substrate. According to some embodiments shown in FIG. 2B, an entirety of the patterned underbump metallurgy (seed) layer 205 and an entirety of the barrier layer 209 may be conformal with respect to the metal pad 203 such that neither extends beyond an edge of the metal pad or onto the passivation layer. According to other embodiments shown in the cross-sectional views of FIG. 2B and 2C, portions of the patterned underbump metallurgy (seed) layer 205 and the barrier layer 209 (shown in the cross-sectional view of FIG. 2C) may extend to and/or overlap the passivation layer 204 while other portions of the patterned underbump metallurgy (seed) layer and barrier layer (shown in the cross-sectional view of FIG. 2B) are set back from the passivation layer.

Figure 2C:
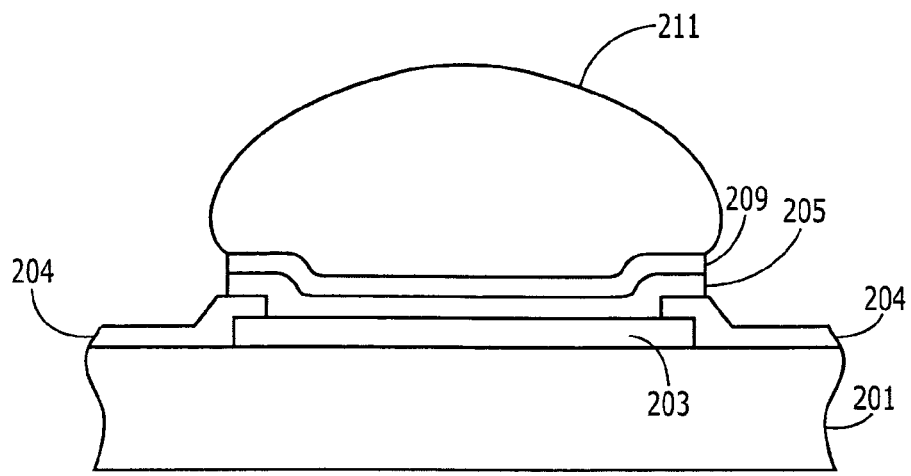

If the metal pad 203 is square and each of the patterned underbump metallurgy layer 205, the barrier layer 209, and the solder bump 211 are maintained within the metal pad 203, the solder bump 211 may have a circular footprint as shown, for example, in FIG. 5. In other embodiments, FIG. 2C may be a cross-sectional view taken at an angle with respect to the cross-section of FIG. 2B. As shown in FIG. 2C, portions of the patterned underbump metallurgy (seed) layer 205, the barrier layer 209, and the solder bump 211 may extend beyond the metal pad 203 onto the passivation layer 204. If the metal pad 203 is square when viewed from the top, and the cross-sections of FIGS. 2B and 2C are at an angle of 45 degrees with respect to each other, the solder bump 211 may have a circular footprint as shown, for example, in FIG. 6. If the metal pad 203 is square when viewed from the top, and the cross-sections of FIGS. 2B and 2C are at an angle of 90 degrees with respect to each other, the solder bump 211 may have an oval footprint as shown, for example in FIG. 7.

In alternatives, the underbump metallurgy (seed) layer 205 may be patterned using the barrier layer 209 without the solder bump 211. The barrier layer 209, for example, may be selectively formed (such as by plating) on the underbump metallurgy (seed) layer 205, and portions of the underbump metallurgy (seed) layer 205 exposed by the barrier layer 209 may be selectively removed. After exposed portions of the underbump metallurgy (seed) layer 205 have been selectively removed, a solder bump or other interconnection structure may be provided on the barrier layer 209. For example, a solid preformed solder structure may be placed on the barrier layer 209, and/or the barrier layer 209 may be bonded with a solder structure on a second substrate.

In addition or in an alternative, a conductive post (such as a copper post) may be provided on the barrier layer 209 instead of the solder bump 211 or between the barrier layer 209 and the solder bump 211. A conductive post may be selectively formed on the barrier layer 209 (such as by plating using plating stencil 207) before selectively removing exposed portions of the underbump metallurgy (seed) layer 205, and/or a conductive post may be placed on the barrier layer 209 after selectively removing exposed portions of the underbump metallurgy (seed) layer 205. A solder structure may then be formed on the conductive post, and/or a solid preformed solder structure may be placed on the conductive post. In an alternative, the conductive post may be bonded with a solder structure on a second substrate.

Figure 3A:
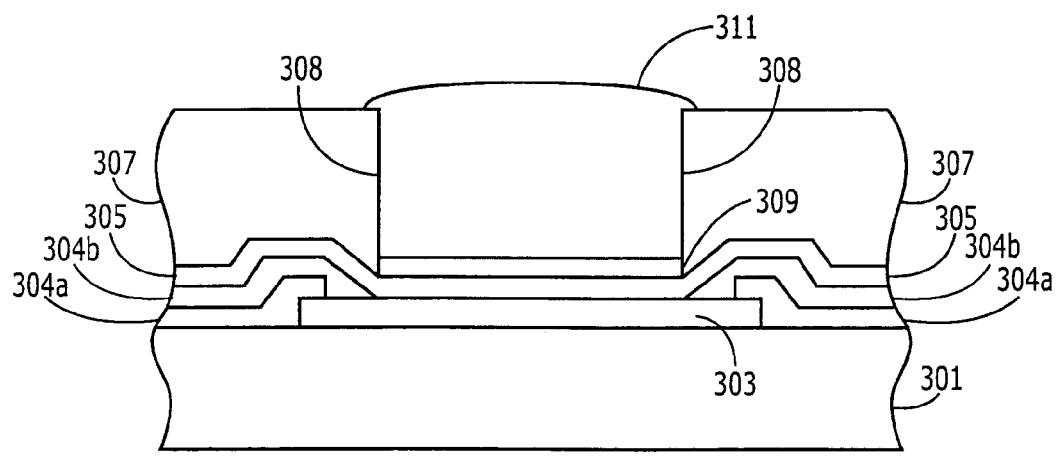
FIGS. 3A-3B are cross-sectional views illustrating steps of forming electronic structures according to still additional embodiments of the present invention.
Figure 3B:
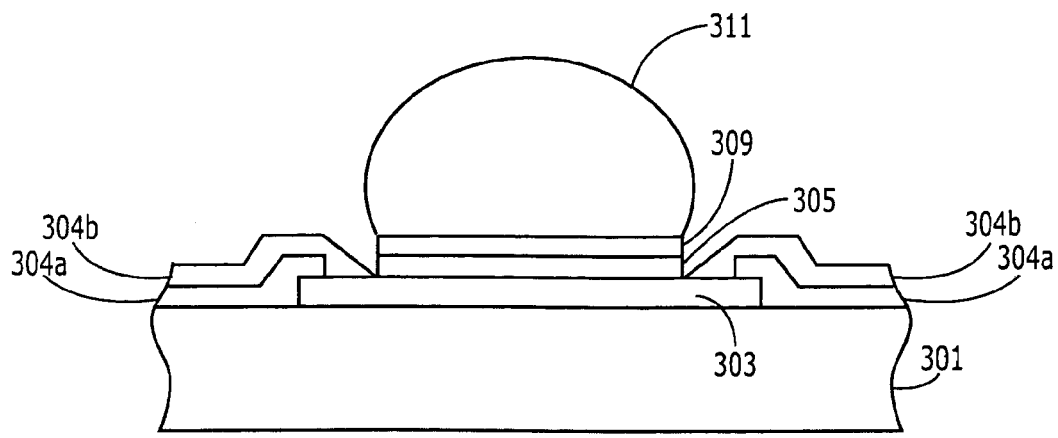

According to third embodiments of the present invention illustrated in the cross-sectional views of FIGS. 3A and 3B, a substrate 301 may be provided with a metal pad 303 and an inorganic dielectric passivation layer 304a (such as silicon oxide layer) and an organic passivation layer 304b (such as polyimide) thereon. For example, the inorganic passivation layer 304a may be formed over the substrate 301 and the metal pad 303 and then patterned to expose portions of the metal pad 303. The organic passivation layer 304b may then be formed on the inorganic passivation layer 304a and on the metal pad 303 and patterned to expose portions of the metal pad 303.

The substrate 301 may be an integrated circuit substrate including integrated circuit devices therein, and the metal pad 303 may provide electrical connection with integrated circuit devices of the substrate 301. More particularly, an exposed surface of the metal pad 303 may comprise aluminum, gold, copper, and/or alloys thereof.

An underbump metallurgy (seed) layer 305 may then be formed on the metal pad 303 and on the organic passivation layer 304b to facilitate subsequent electroplating. The underbump metallurgy (seed) layer 305 may include an adhesion layer adjacent the organic passivation layer 304b and metal pad 303 and a conduction layer on the adhesion layer opposite the organic passivation layer 304b and metal pad 303. More particularly, the adhesion layer may include titanium-tungsten (TiW), and the conduction layer may include copper (Cu), Silver (Ag), gold (Au), Palladium (Pd), and/or alloys thereof. The underbump metallurgy (seed) layer 305 may also include an intermediate layer between adhesion and conduction layers, and the intermediate layer may include titanium (Ti) and/or titanium nitride (TiN).

A plating stencil (mask) 307 is then formed on the underbump metallurgy (seed) layer 305, and a hole 308 in the plating stencil 307 exposes portions of the underbump metallurgy (seed) layer 305. More particularly, the hole 308 exposes an area of the underbump metallurgy (seed) layer 305 that is no greater than an area of the metal pad 303 exposed by the organic passivation layer 304b so that portions of the underbump metallurgy (seed) layer 305 exposed by the hole 308 do not extend over the organic passivation layer 304b as shown in FIG. 3A. The plating stencil (mask) 307, for example, may be a layer of an organic or inorganic photo-imagable material such as photoresist, and the hole may be formed using photolithography. More particularly, the plating stencil (mask) 307 may be formed by spinning or laminating the material on the underbump metallurgy (seed) layer 305, baking the material, selectively exposing the material to radiation (such as light), and developing the material to form the hole 308. In addition or in an alternative, the plating stencil (mask) 307 may be formed using electro-deposition.

A barrier layer 309 may then be selectively formed (such as by plating) on portions of the underbump metallurgy (seed) layer 305 exposed through the hole 308. The barrier layer 309, for example, may include nickel, copper, and/or alloys thereof. After plating the barrier layer 309, a solder bump 311 is plated in the hole 308 on the barrier layer 309. The solder bump 311 may include an alloy such as a tin-lead (SnPb) solder, or the solder bump 311 may be lead free.

Once the barrier layer 309 and the solder bump 311 are plated, the plating stencil (mask) 307 can be removed as shown in FIG. 3B. As further shown in FIG. 3B, portions of the underbump metallurgy (seed) layer 305 not covered by the barrier layer 309 and/or solder bump 311 may be removed, and the solder bump 311 may be subjected to reflow to provide a solder ball. For example, exposed portions of the underbump metallurgy (seed) layer 305 may be removed using an etch chemistry that removes the underbump metallurgy (seed) layer selectively with respect to the barrier layer 309. Accordingly, the patterned underbump metallurgy (seed) layer 305 may be undercut with respect to the barrier layer 309.

More particularly, the underbump metallurgy (seed) layer 305 may be removed using an etch chemistry that removes at least a remaining portion of the underbump metallurgy (seed) layer 305 selectively with respect to the metal pad 303 and/or the organic passivation layer 304b. For example, peroxide ($H_2O_2$) may be used to remove a TiW adhesion layer of the underbump metallurgy (seed) layer 305 selectively with respect to an aluminum (or other) pad metal 303. Reflow of the solder bump 311 may be performed after removing a solder wettable conduction layer of the underbump metallurgy (seed) layer 305 but before removing a solder non-wettable adhesion layer of the underbump metallurgy (seed) layer 305 so that the solder bump 311 does not spread across exposed portions of the metal pad 303.

In an alternative, the metal pad 303 may include a solder non-wettable metal (such as aluminum) on a surface thereof so that reflow of the solder bump 311 may be performed after removing the underbump metallurgy (seed) layer 305 without the solder bump 311 spreading across exposed portions of the metal pad 303. In another alternative, reflow of the solder bump 311 may be performed without flux to maintain an oxide thereon so that the solder bump 311 does not spread across an exposed wettable surface such as a conduction layer of the underbump metallurgy (seed) layer 305 (before removing exposed portions of the underbump metallurgy layer) or the metal pad 303 (after removing exposed portions of the underbump metallurgy layer). In still another alternative, the organic passivation layer 304b may act as a solder dam to confine the solder bump 311 during reflow.

Reflow of the solder bump 311 may be performed above a liquidus temperature of the solder bump 311, or reflow of the solder bump 311 may not exceed a liquidus temperature of the solder bump 311. In yet another alternative, the solder bump 311 may not be subjected to reflow.

As shown in FIG. 3B, edge portions of the metal pad 303 may be covered by the organic passivation layer 304b, and central portions of the metal pad 303 may be covered by the remaining portions of the underbump metallurgy (seed) layer 305, the barrier layer 309, and the solder bump 311. According to particular embodiments of the present invention, an entirety of the surface of the metal pad 303 may be covered by the passivation layers 304a-b and the barrier layer. The barrier layer 309 and/or remaining portions of the underbump metallurgy (seed) layer 305, however, may not extend onto the organic passivation layer 304b. An integrity of the patterned underbump metallurgy (seed) layer 305, the barrier layer 309, and/or the solder bump 311 may thus be enhanced by not providing portions thereof on the potentially flexible organic passivation layer 304b. In an alternative, portions of the metal pad 303 between the passivation layer 304b and the patterned underbump metallurgy layer 305 may remain exposed after forming the barrier layer 309 and the solder bump 311, and/or after reflowing the solder bump 311.

As further shown in FIGS. 3A and 3B, the metal pad 303 may be considered to be "below" or "beneath" a surface of the substrate because portions of the metal pad 303 may be covered by the passivation layers 304a and/or 304b before forming the underbump metallurgy (seed) layer 305, the barrier layer 309, and the solder bump 311. Stated in other words, the passivation layers 304a and/or 304b may be considered as a part of the substrate.

As shown in FIG. 3B, the solder bump 311 may extend beyond the barrier layer 309 in a dimension parallel to the substrate after reflow. Accordingly, the solder bump 311 may partially overlap portions of the passivation layer 304b. If the passivation layer 304b exposes a square portion of the metal pad 303 and the barrier layer 309 and solder bump 311 are plated in a circular or oval hole 308 on a circular or oval portion of the metal pad 303, the solder bump 311 may overlap portions of the passivation layer 304b in some areas, and portions of the metal pad 303 may remain exposed in other areas, as illustrated, for example, in FIG. 6 and/or FIG. 7. According to some embodiments shown in FIG. 3B, an entirety of the patterned underbump metallurgy (seed) layer 305 and an entirety of the barrier layer 309 may be conformal with respect to the metal pad 303 such that neither extends beyond an edge of the metal pad or onto the passivation layer. According to other embodiments shown in FIGS. 3B, portions of the patterned underbump metallurgy (seed) layer 305 and the barrier layer 309 may extend to and/or overlap the passivation layers 304b and/or 304a while other portions of the patterned underbump metallurgy (seed) layer and barrier layer are set back from the passivation layer.

In alternatives, the underbump metallurgy (seed) layer 305 may be patterned using the barrier layer 309 without the solder bump 311. The barrier layer 309, for example, may be selectively formed (such as by plating) on the underbump metallurgy (seed) layer 305, and portions of the underbump metallurgy (seed) layer 305 exposed by the barrier layer 309 may be selectively removed. After exposed portions of the underbump metallurgy (seed) layer 305 have been selectively removed, a solder bump or other interconnection structure may be provided on the barrier layer 309. For example, a solid preformed solder structure may be placed on the barrier layer 309, and/or the barrier layer 309 may be bonded with a solder structure on a second substrate.

In addition or in an alternative, a conductive post (such as a copper post) may be provided on the barrier layer 309 instead of the solder bump 311 or between the barrier layer 309 and the solder bump 311. A conductive post may be selectively formed on the barrier layer 309 (such as by plating using plating stencil 307) before selectively removing exposed portions of the underbump metallurgy (seed) layer 305, and/or a conductive post may be placed on the barrier layer 309 after selectively removing exposed portions of the underbump metallurgy (seed) layer 305. A solder structure may then be formed on the conductive post, and/or a solid preformed solder structure may be placed on the conductive post. In an alternative, the conductive post may be bonded with a solder structure on a second substrate.

Figure 4A:
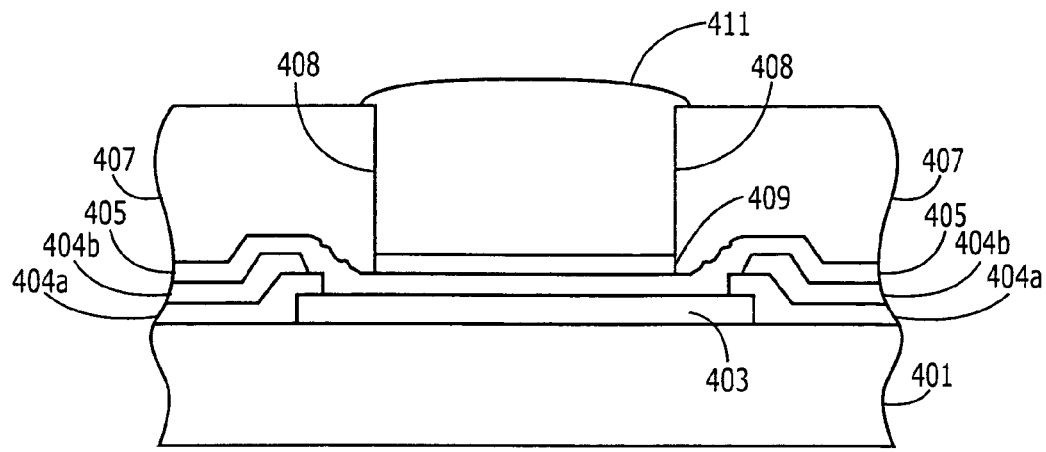
FIGS. 4A-4C are cross-sectional views illustrating steps of forming electronic structures according to yet additional embodiments of the present invention.
Figure 4B:
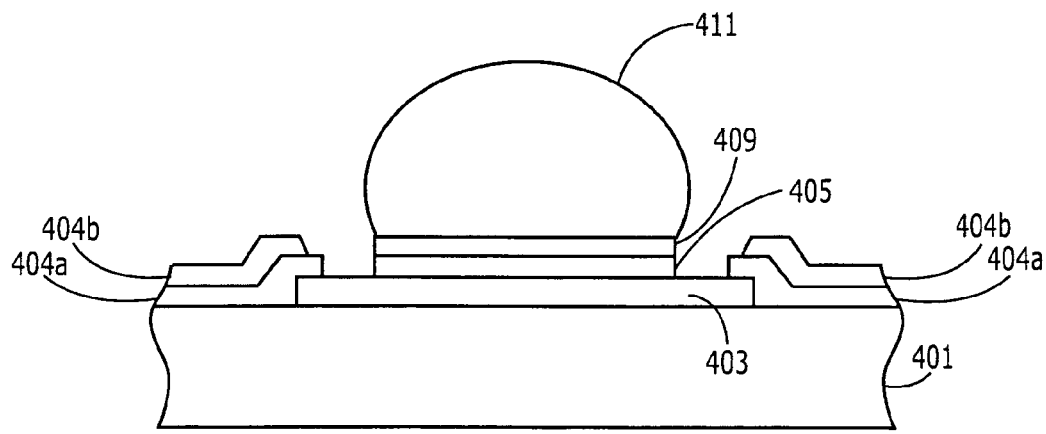

According to fourth embodiments of the present invention illustrated in the cross-sectional views of FIGS. 4A and 4B, a substrate 401 may be provided with a metal pad 403 and an inorganic dielectric passivation layer 404a (such as silicon oxide layer) and an organic passivation layer 404b (such as polyimide) thereon. For example, the inorganic passivation layer 404a and the organic passivation layer 404b may be formed over the substrate 401 and the metal pad 403. Both the inorganic and organic passivation layers 404a-b may then be patterned using a single masking step to expose portions of the metal pad 403.

The substrate 401 may be an integrated circuit substrate including integrated circuit devices therein, and the metal pad 403 may provide electrical connection with integrated circuit devices of the substrate 401. More particularly, an exposed surface of the metal pad 403 may comprise aluminum, gold, copper, and/or alloys thereof.

An underbump metallurgy (seed) layer 405 may then be formed on the metal pad 403 and on the passivation layers 404a-b to facilitate subsequent electroplating. The underbump metallurgy (seed) layer 405 may include an adhesion layer adjacent the passivation layers 404a-b and metal pad 403 and a conduction layer on the adhesion layer opposite the passivation layers 404a-b and metal pad 403. More particularly, the adhesion layer may include titanium-tungsten (TiW), and the conduction layer may include copper (Cu), Silver (Ag), gold (Au), Palladium (Pd), and/or alloys thereof. The underbump metallurgy (seed) layer 405 may also include an intermediate layer between adhesion and conduction layers, and the intermediate layer may include titanium (Ti) and/or titanium nitride (TiN).

A plating stencil (mask) 407 is then formed on the underbump metallurgy (seed) layer 405, and a hole 408 in the plating stencil 407 exposes portions of the underbump metallurgy (seed) layer 405. More particularly, the hole 408 exposes an area of the underbump metallurgy (seed) layer 405 that is less than an area of the metal pad 403 exposed by the passivation layers 404a-b so that portions of the underbump metallurgy (seed) layer 405 exposed by the hole 408 do not extend over the passivation layers 404a-b as shown in FIG. 4A. The plating stencil (mask) 407, for example, may be a layer of an organic or inorganic photo-imagable material such as photoresist, and the hole may be formed using photolithography. More particularly, the plating stencil (mask) 407 may be formed by spinning or laminating the material on the underbump metallurgy (seed) layer 405, baking the material, selectively exposing the material to radiation (such as light), and developing the material to form the hole 408. In addition or in an alternative, the plating stencil (mask) 407 may be formed using electro-deposition.

A barrier layer 409 may then be selectively formed (such as by plating) on portions of the underbump metallurgy (seed) layer 405 exposed through the hole 408. The barrier layer 409, for example, may include nickel, copper, and/or alloys thereof. After plating the barrier layer 409, a solder bump 411 is plated in the hole 408 on the barrier layer 409. The solder bump 411 may include an alloy such as a tin-lead (SnPb) solder, or the solder bump 411 may be lead free.

Once the barrier layer 409 and the solder bump 411 are plated, the plating stencil (mask) 407 can be removed as shown in FIG. 4B. As further shown in FIG. 4B, portions of the underbump metallurgy (seed) layer 405 not covered by the barrier layer 409 and/or solder bump 411 may be removed, and the solder bump 411 may be subjected to reflow to provide a solder ball. For example, exposed portions of the underbump metallurgy (seed) layer 405 may be removed using an etch chemistry that removes the underbump metallurgy (seed) layer selectively with respect to the barrier layer 409. Accordingly, the patterned underbump metallurgy (seed) layer 405 may be undercut with respect to the barrier layer 409.

More particularly, the underbump metallurgy (seed) layer 405 may be removed using an etch chemistry that removes at least a remaining portion of the underbump metallurgy (seed) layer 405 selectively with respect to the metal pad 403 and/or the organic passivation layer 404b. For example, peroxide ($H_2O_2$) may be used to remove a TiW adhesion layer of the underbump metallurgy (seed) layer 405 selectively with respect to an aluminum (or other) pad metal 403. Reflow of the solder bump 411 may be performed after removing a solder wettable conduction layer (such as copper) of the underbump metallurgy (seed) layer 405 but before removing a solder non-wettable adhesion layer (such as TiW) of the underbump metallurgy (seed) layer 405 so that the solder bump 411 does not spread across exposed portions of the metal pad 403.

In an alternative, the metal pad 403 may include a solder non-wettable metal (such as aluminum) on a surface thereof so that reflow of the solder bump 411 may be performed after removing the underbump metallurgy (seed) layer 405 without the solder bump 411 spreading across exposed portions of the metal pad 403. In another alternative, reflow of the solder bump 411 may be performed without flux to maintain an oxide thereon so that the solder bump 411 does not spread across an exposed wettable surface such as a conduction layer of the underbump metallurgy (seed) layer 405 (before removing exposed portions of the underbump metallurgy layer) or the metal pad 403 (after removing exposed portions of the underbump metallurgy layer). Reflow of the solder bump 411 may be performed above a liquidus temperature of the solder bump 411, or reflow of the solder bump 411 may not exceed a liquidus temperature of the solder bump 411. In yet another alternative, the solder bump 411 may not be subjected to reflow.

As shown in FIG. 4B, edge portions of the metal pad 403 may be covered by the passivation layers 404a-b, and central portions of the metal pad 403 may be covered by the remaining portions of the underbump metallurgy (seed) layer 405, the barrier layer 409, and the solder bump 411. Portions of the metal pad 403 between the passivation layers 404a-b and the patterned underbump metallurgy layer 405, however, may remain exposed after forming the barrier layer 409 and the solder bump 411, and/or after reflowing the solder bump 411.

As further shown in FIGS. 4A and 4B, the metal pad 403 may be considered to be "below" or "beneath" a surface of the substrate because portions of the metal pad 403 may be covered by the passivation layers 404a and/or 404b before forming the underbump metallurgy (seed) layer 405, the barrier layer 409, and the solder bump 411. Stated in other words, the passivation layers 404a and/or 404b may be considered as a part of the substrate. According to some embodiments shown in FIG. 4B, an entirety of the patterned underbump metallurgy (seed) layer 405 and an entirety of the barrier layer 409 may be conformal with respect to the metal pad 403 such that neither extends beyond an edge of the metal pad or onto the passivation layer. According to other embodiments shown in the cross-sectional views of FIGS. 4B and 4C, portions of the patterned underbump metallurgy (seed) layer 405 and the barrier layer 409 (shown in the cross-sectional view of FIG. 4C) may extend to and/or overlap the passivation layers 404a and/or 404b while other portions of the patterned underbump metallurgy (seed) layer and barrier layer (shown in the cross-sectional view of FIG. 4B) are set back from the passivation layer(s).

Figure 4C:
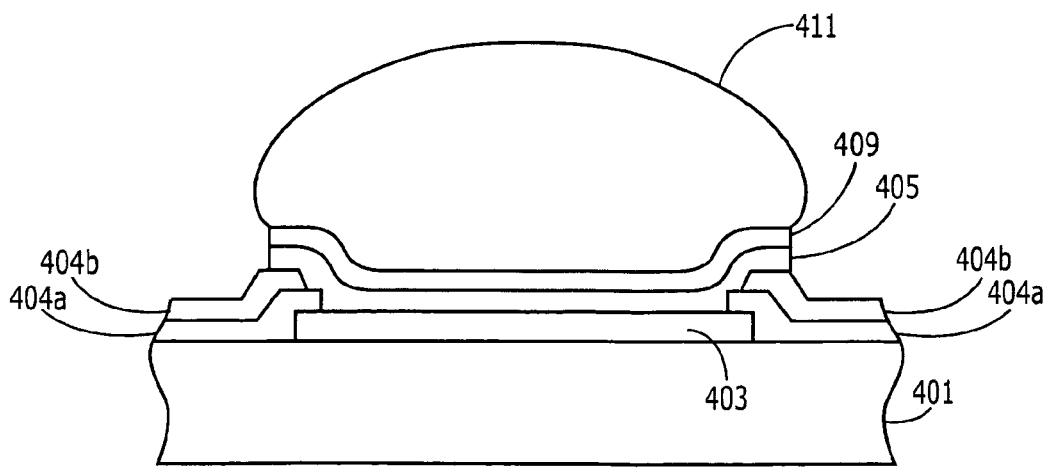

If the exposed portion of the metal pad 403 is square and each of the patterned underbump metallurgy layer 405, the barrier layer 409, and the solder bump 411 are maintained within the exposed portion of the metal pad 403, the solder bump 411 may have a circular footprint as shown, for example, in FIG. 5. In other embodiments, FIG. 4C may be a cross-sectional view taken at an angle with respect to the cross-section of FIG. 4B. As shown in FIG. 4C, portions of the patterned underbump metallurgy (seed) layer 405, the barrier layer 409, and the solder bump 411 may extend beyond the metal pad 403 onto the passivation layers 404a and 404b. If the metal pad 403 is square when viewed from the top, and the cross-sections of FIGS. 4B and 4C are at an angle of 45 degrees with respect to each other, the solder bump 411 may have a circular footprint as shown, for example, in FIG. 6. If the metal pad 403 is square when viewed from the top, and the cross-sections of FIGS. 4B and 4C are at an angle of 90 degrees with respect to each other, the solder bump 411 may have an oval footprint as shown, for example in FIG. 7.

In alternatives, the underbump metallurgy (seed) layer 405 may be patterned using the barrier layer 409 without the solder bump 411. The barrier layer 409, for example, may be selectively formed (such as by plating) on the underbump metallurgy (seed) layer 405, and portions of the underbump metallurgy (seed) layer 405 exposed by the barrier layer 409 may be selectively removed. After exposed portions of the underbump metallurgy (seed) layer 405 have been selectively removed, a solder bump or other interconnection structure may be provided on the barrier layer 409. For example, a solid preformed solder structure may be placed on the barrier layer 409, and/or the barrier layer 409 may be bonded with a solder structure on a second substrate.

In addition or in an alternative, a conductive post (such as a copper post) may be provided on the barrier layer 409 instead of the solder bump 411 or between the barrier layer 409 and the solder bump 411. A conductive post may be selectively formed on the barrier layer 409 (such as by plating using plating stencil 407) before selectively removing exposed portions of the underbump metallurgy (seed) layer 405, and/or a conductive post may be placed on the barrier layer 409 after selectively removing exposed portions of the underbump metallurgy (seed) layer 405. A solder structure may then be formed on the conductive post, and/or a solid preformed solder structure may be placed on the conductive post. In an alternative, the conductive post may be bonded with a solder structure on a second substrate.

As shown in the top view of FIG. 5, edge portions of a metal pad 503 may be covered by a passivation layer 504, such as a passivation layer including one or more organic and/or inorganic dielectric layers. Moreover, a solder bump 511 may be formed on a central portion of the metal pad 503 according to embodiments of the present invention such that portions of the metal pad 503 are exposed between the passivation layer 504 and the solder bump 511. As discussed above with respect to FIGS. 1A-B, 2A-B, 3A-B, and 4A-B, an underbump metallurgy layer, a barrier layer, and/or a conductive post may be provided between the solder bump 511 and the metal pad 503, but the underbump metallurgy layer, the barrier layer, and/or the conductive post are not visible in the top view of FIG. 5. The structure of FIG. 5, for example, may be provided as discussed above with respect to FIGS. 1A-B, 2A-B, 3A-B, and/or 4A-B. As discussed above, a conductive post (such as a copper post) may be provided in addition to or instead of the solder bump 511.

Figure 6:
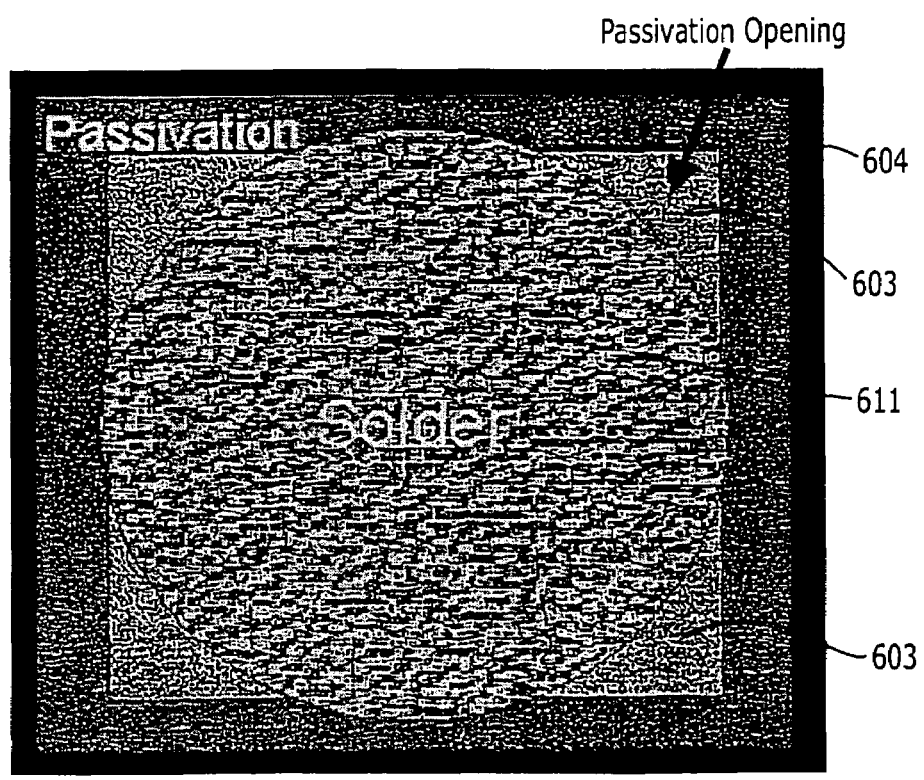

As shown in the top view of FIG. 6, edge portions of a metal pad 603 may be covered by a passivation layer 604, such as a passivation layer including one or more organic and/or inorganic dielectric layers. Moreover, a round solder bump 611 may be formed on a central portion of the metal pad 603 according to embodiments of the present invention such that portions of the metal pad 603 are exposed between the passivation layer 604 and the solder bump 611. As discussed above with respect to FIGS. 1A-B, 2A-B, 3A-B, and 4A-B, an underbump metallurgy layer, a barrier layer, and/or a conductive post may be provided between the solder bump 611 and the metal pad 603, but the underbump metallurgy layer, the barrier layer, and/or the conductive post are not visible in the top view of FIG. 6. In the structure of FIG. 6, portions of the solder bump, the underbump metallurgy layer, the barrier layer, and/or the conductive post may extend to and/or overlap the passivation layer 604 while other portions of the solder bump 611, the underbump metallurgy layer, the barrier layer, and/or the conductive post are set back from the passivation layer 604. The structure of FIG. 6, for example, may be provided as discussed above with respect to FIGS. 1A-B, 2A-B, 3A-B, and 4A-B. As discussed above, a conductive post (such as a copper post) may be provided in addition to or instead of the solder bump 611.

Figure 7:
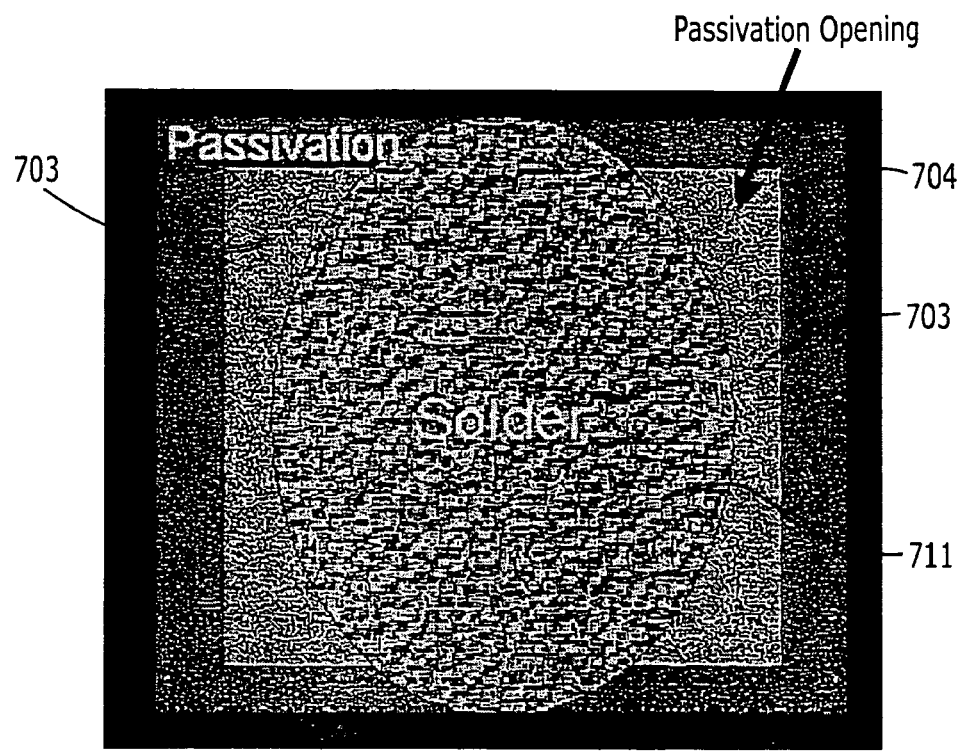

As shown in the top view of FIG. 7, edge portions of a metal pad 703 may be covered by a passivation layer 704, such as a passivation layer including one or more organic and/or inorganic dielectric layers. Moreover, an oval solder bump 711 may be formed on a central portion of the metal pad 703 according to embodiments of the present invention such that portions of the metal pad 703 are exposed between the passivation layer 704 and the solder bump 711. As discussed above, an underbump metallurgy layer, a barrier layer, and/or a conductive post may be provided between the solder bump 711 and the metal pad 703, but the underbump metallurgy layer, the barrier layer, and/or the conductive post are not visible in the top view of FIG. 7. In the structure of FIG. 7, portions of the solder bump, the underbump metallurgy layer, the barrier layer, and/or the conductive post may extend to and/or overlap the passivation layer 704 while other portions of the solder bump 711, the underbump metallurgy layer, the barrier layer, and/or the conductive post are set back from the passivation layer 704. More particularly, portions of the patterned underbump metallurgy (seed) layer, the barrier layer, and/or the conductive post may extend to and/or overlap the passivation layer 704 while other portions of the patterned underbump metallurgy (seed) layer, barrier layer, and/or conductive post are set back from the passivation layer. The structure of FIG. 7, for example, may be provided as discussed above with respect to FIGS. 1A-B, 2A-B, 3A-B, and 4A-B. As discussed above, a conductive post (such as a copper post) may be provided in addition to or instead of the solder bump 711.

Figure 8:
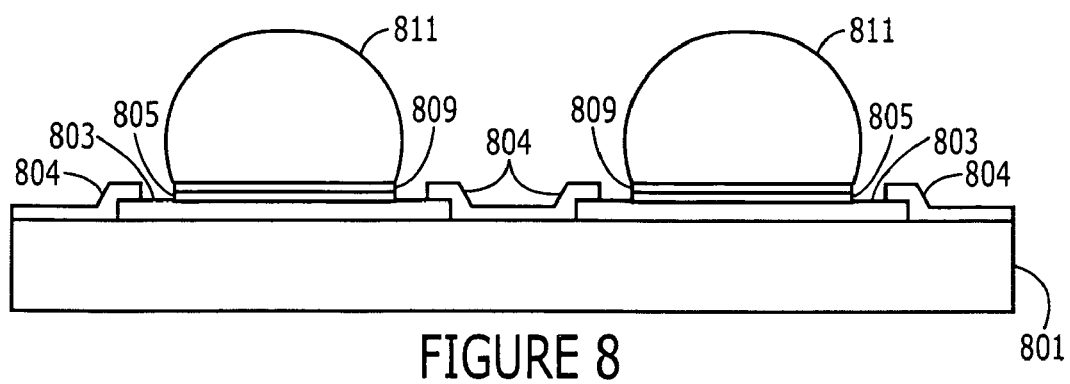
FIG. 8 is a cross-sectional view illustrating a plurality of interconnection structures on a substrate according to embodiments of the present invention.

As shown in the cross-sectional view of FIG. 8, solder bumps 811 provided according to embodiments of the present invention may allow a closer placement of metal pads 803 and solder bumps 811 to provide a tighter pitch on the integrated circuit device. More particularly, the solder bumps 811 can be provided on central portions of the metal pads 803 with portions of the metal pads 803 exposed adjacent to the solder bumps 811. Accordingly, shorting of adjacent solder bumps 811 can be reduced. Moreover, an additional passivation layer is not required to confine the solder within the central portion of the metal pad 803.

As discussed above, the metal pads 803 are provided on substrate 801, and a passivation layer 804 may extend onto edge portions of the metal pads 803. The underbump metallurgy (seed) layer 805, the barrier layer 809, and the solder bump 811 may be formed as discussed above with regard to FIGS. 1A-B, 2A-B, 3A-B, and/or 4A-B. In some embodiments, edge portions of the metal pads 803 may be free of the passivation layer 804 as discussed above with respect to FIGS. 1A-B.

Figure 9:
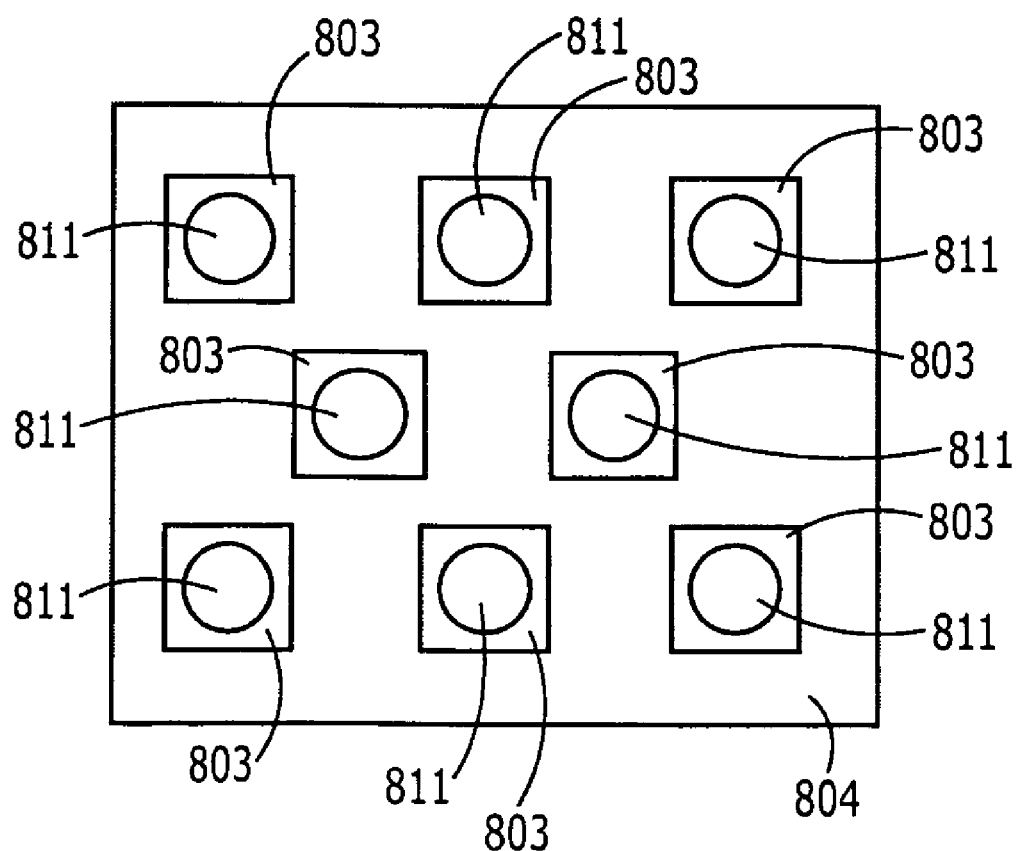
FIG. 9 is a plan view illustrating an array of interconnection structures according to embodiments of the present invention.

Moreover, the metal pads 803 may be provided in staggered rows to further increase a pitch or density of the solder bumps 811 and/or to provide larger solder bumps 811 on the substrate 801. For example, metal pads 803 may be arranged in a checker board pattern as illustrated in the top view of FIG. 9. A likelihood of shorts between solder bumps 811 may be reduced if one or more solder bumps 811 extends beyond the exposed portion of the respective metal pad 803 over the passivation layer 804.

Figure 10A:
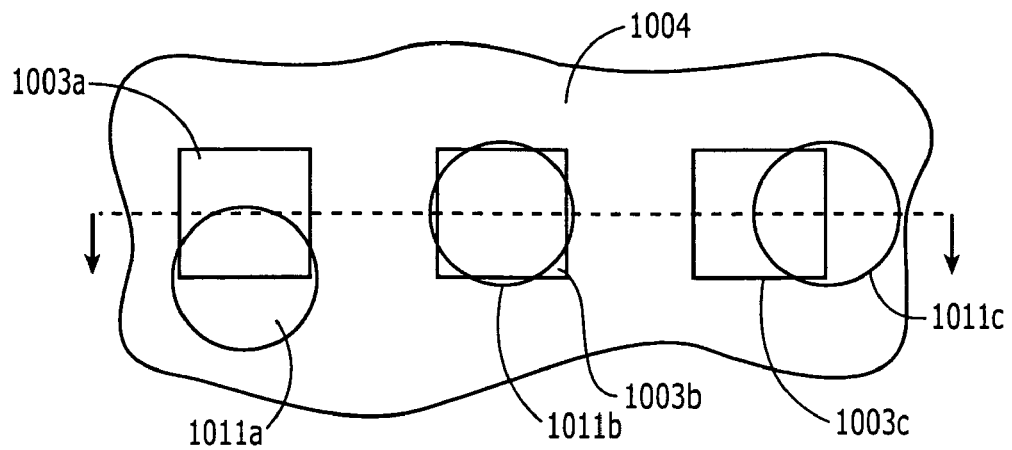
FIGS. 10A-10B are respective plan and cross-sectional views illustrating a plurality of interconnection structures on a substrate according to embodiments of the present invention.
Figure 10B:
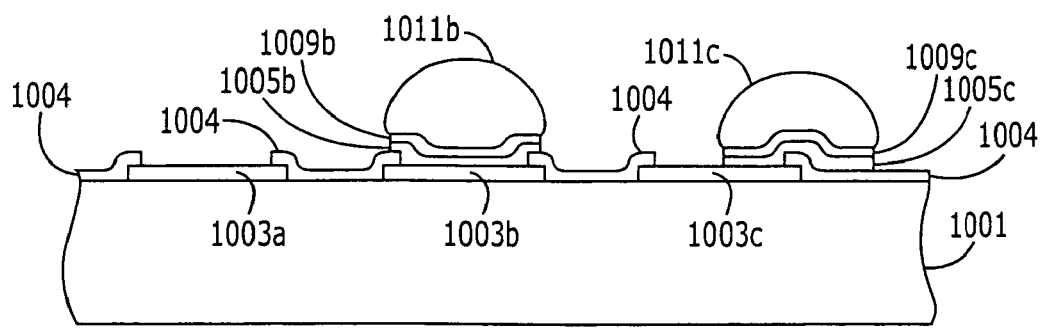

FIG. 10A is a plan view of an electronic substrate including a plurality of interconnection structures on a substrate according to additional embodiments of the present invention, and FIG. 10B is a cross-sectional view taken along the section line of FIG. 10A. In particular, portions of a plurality of metal pads 1003a-c may be exposed through a passivation layer 1004 on substrate 1001. As shown, edge portions of the metal pads 1003a-c may be covered by the passivation layer 1004. In other embodiments, edge portions of the metal pads 1003a-c may be free of the passivation layer 1004. Moreover, patterned seed layers 1005a-c and barrier layers 1009a-c may be provided between respective solder bumps 1011a-c and metal pads 1003a-c. Moreover, the passivation layer 1004 may include one or more organic and/or inorganic dielectric layers.

The structures of FIGS. 10A-B may be formed as discussed above with regard to FIGS. 1A-C, 2A-C, 3A-B, and/or 4A-C. For example, a continuous underbump metallurgy (seed) layer may be formed on the passivation layer 1004 and metal pads 1003a-c to provide an electroplating electrode, and a plating stencil may be formed on the continuous underbump metallurgy (seed) layer. The plating stencil, for example, may expose circular areas of the continuous underbump metallurgy (seed) layer at least portions of which are on respective metal pads 1003a-c. The barrier layers 1009a-c can then be selectively formed (such as by plating) on exposed portions of the continuous underbump metallurgy layer. The plating stencil can then be removed, and portions of the continuous underbump metallurgy (seed) layer exposed by the barrier layers 1009a-c can be removed to provide the patterned underbump metallurgy (seed) layers 1005a-c.

The solder bumps 1011a-c can be formed on the barrier layers, for example, by plating before removing the plating stencil and before removing exposed portions of the underbump metallurgy (seed) layer. In other embodiments, solid preformed solder structures may be placed on the barrier layers 1009a-c, and/or the barrier layer 1009a-c may be bonded with solder structures on a second substrate. In still other embodiments, conductive posts (such as copper posts) may be provided on the barrier layers 1009a-c instead of the solder bumps 1011a-c or between the barrier layers 1009a-c and the solder bumps 1011a-c. Conductive posts may be selectively formed on the barrier layers 1009a-c (such as by plating using the plating stencil) before selectively removing exposed portions of the continuous underbump metallurgy (seed) layer, and/or conductive posts may be placed on the barrier layers 1009a-c after selectively removing exposed portions of the continuous underbump metallurgy (seed) layer. Solder structures may then be formed on the conductive posts, and/or solid preformed solder structures may be placed on the conductive posts. In an alternative, the conductive posts may be bonded with solder structures on a second substrate.

As shown in FIGS. 10A and 10B, relative placements of barrier layers 1009a-c solder bumps 1011a-c on respective metal pads 1003a-c may vary. For example, the barrier layer 1009b and solder bump 1011b may be substantially centered with respect to metal pad 1003b, while the barrier layers 1009a and 1009c and the solder bumps 1011a and 1001c may be offset in different directions relative to the metal pads 1003a and 1003b. Accordingly, barrier layers, solder bumps, and/or other interconnections structures may be redistributed with respect to metal pads without requiring redistribution lines and/or patterning thereof Embodiments of the present invention may thus allow forming a solder bump on a metal input/output pad without completely sealing the metal input/output pad with the patterned underbump metallurgy (seed) layer, the barrier layer, and/or passivation. The patterned underbump metallurgy (seed) layer and the barrier layer may thus be contained within exposed portions of the metal input/output pad and/or portions of the underbump metallurgy (seed) layer and the barrier layer may extend beyond exposed portions of the metal input/output pad. For example, portions of an insulating passivation layer may extend between the metal input/output pad and edge portions of the underbump metallurgy (seed) layer and barrier layer, while other portions of the insulating passivation layer may be separated from the underbump metallurgy (seed) layer and the barrier layer by exposed portions of the metal input/output pad therebetween. Accordingly, the resulting solder bump may be smaller than an exposed portion of the corresponding metal input/output pad in one or more dimensions without requiring another passivation step. Accordingly, solder bumps can be formed on more closely spaced pads without requiring an additional passivation layer and with reduced risk of electrical shorts therebetween.

While the present invention has been particularly shown and described with reference to embodiments thereof, it will be understood by those skilled in the art that various changes in form and details may be made therein without departing from the spirit and scope of the invention as defined by the appended claims and their equivalents.

That which is claimed is:

1. A method of forming an electronic structure, the method comprising:
   providing a substrate having a metal pad thereon and an insulating layer surrounding the metal pad;
   forming a conductive barrier layer on a first portion of the metal pad, wherein a second exposed portion of the metal pad is free of the conductive barrier layer and free of the insulating layer; and
   providing an interconnection structure on the conductive barrier layer, wherein the conductive barrier layer is between the interconnection structure and the metal pad and wherein the interconnection structure and the conductive barrier layer include different materials.

2. A method of forming an electronic structure according to claim 1 wherein forming the conductive barrier layer comprises,
   forming a conductive seed layer on the metal pad and on the insulating layer,
   selectively forming the conductive barrier layer on a portion of the conductive seed layer on the first portion of the metal pad so that a second portion of the seed layer on the second portion of the metal pad is free of the conductive barrier layer, and
   after selectively forming the conductive barrier layer, removing the second portion of the seed layer from the second portion of the metal pad.

3. A method according to claim 2 wherein removing the second portion of the seed layer comprises etching the second portion of the seed layer using an etch chemistry that etches at least a portion of the conductive seed layer preferentially with respect to the conductive barrier layer and the metal pad.

4. A method according to claim 1 wherein the exposed second portion of the metal pad surrounds the conductive barrier layer.

5. A method according to claim 1 wherein a portion of the conductive barrier layer extends beyond an edge of the metal pad.

6. A method according to claim 1 wherein the insulating layer extends on an edge portion of the metal pad opposite the substrate so that the second portion of the metal pad is exposed between the conductive barrier layer and the insulating layer.

7. A method according to claim 1 wherein a portion of the conductive barrier layer extends on a portion of the insulating layer.

8. A method according to claim 1 wherein a center of the conductive barrier layer is substantially aligned with respect to a center of the metal pad.

9. A method according to claim 1 wherein a center of the conductive barrier layer is substantially offset with respect to a center of the metal pad.

10. A method according to claim 1 further comprising:
    providing a second metal pad on the substrate, wherein the first and second metal pads are spaced apart; and
    forming a second conductive barrier layer on a portion of the second metal pad, wherein an alignment of the first conductive barrier layer relative to the first metal pad is different than an alignment of the second conductive barrier layer relative to the second metal pad.

11. A method according to claim 10 wherein the first conductive barrier layer is substantially aligned relative to the first metal pad and wherein the second conductive barrier layer is substantially offset relative to the second metal pad.

12. A method according to claim 10 wherein the first conductive barrier layer is substantially offset in a first direction relative to the first metal pad and wherein the second conductive barrier layer is substantially offset in a second direction relative to the second metal pad and wherein the first and second directions are different.

13. A method according to claim 1 wherein the interconnection structure includes a solder bump and/or a copper post.

14. A method according to claim 1 wherein the metal pad includes aluminum, copper, gold, and/or alloys thereof, wherein the conductive barrier layer includes nickel, copper, and/or alloys thereof, and wherein the interconnection structure includes solder and/or copper.

15. A method according to claim 1 wherein the metal pad includes aluminum and the conductive barrier layer includes nickel.

16. A method according to claim 1 wherein at least a portion of the metal pad is on a portion of the insulating layer so that a surface of the metal pad opposite the substrate is free of the insulating layer.

17. A method of forming an electronic structure, the method comprising:
   providing a substrate having a metal pad thereon;
   forming an underbump metallurgy layer on a surface of the metal pad wherein the metal pad is between the underbump metallurgy layer and the substrate;
   forming a conductive barrier layer on the underbump metallurgy layer wherein the underbump metallurgy layer is between the conductive barrier layer and the metal pad, wherein an entirety of the underbump metallurgy layer and the conductive barrier layer is directly on and conformal with respect to the surface of the metal pad, and wherein the conductive barrier layer and the underbump metallurgy layers comprise different materials; and
   forming a solder bump on the conductive barrier layer wherein the conductive barrier layer is between the solder bump and the underbump metallurgy layer, and wherein the conductive barrier layer and the solder bump comprise different materials.

18. A method of forming an electronic structure, the method comprising:
   providing a substrate having a metal pad thereon and an insulating layer surrounding the metal pad;
   forming an underbump metallurgy layer on a surface of the metal pad wherein the metal pad is between the underbump metallurgy layer and the substrate;
   forming a conductive barrier layer on the underbump metallurgy layer wherein the underbump metallurgy layer is between the conductive barrier layer and the metal pad, and wherein the conductive barrier layer and the underbump metallurgy layer comprise different materials; and
   forming a solder bump on the conductive barrier layer wherein the conductive barrier layer is between the solder bump and the underbump metallurgy layer, wherein the conductive barrier layer and the solder bump comprise different materials, and wherein a portion of the metal pad is free of the insulating layer, the underbump metallurgy layer, the conductive barrier layer, and the solder bump.

19. A method according to claim 1 wherein portions of the metal pad extend beyond portions of the conductive barrier layer in a direction parallel to a surface of the substrate.

20. A method according to claim 17 wherein portions of the metal pad extend beyond portions of the conductive barrier layer in a direction parallel to a surface of the substrate.

21. A method according to claim 18 wherein portions of the metal pad extend beyond portions of the conductive barrier layer in a direction parallel to a surface of the substrate.

22. A method according to claim 17 wherein forming the under bump metallurgy layer comprises,
   before forming the conductive barrier layer, forming the under bump metallurgy layer on the metal pad, and
   after forming the conductive barrier layer, removing portions of the under bump metallurgy layer that are free of the conductive barrier layer.

23. A method according to claim 17 wherein forming the conductive barrier layer comprises selectively forming the conductive barrier layer on a portion of the under bump metallurgy layer on a first portion of the metal pad so that a second portion of the under bump metallurgy layer on a second portion of the metal pad is free of the conductive barrier layer, the method further comprising:
   after selectively forming the conductive barrier layer, removing the second portion of the under bump metallurgy layer from the second portion of the metal pad so that the second portion of the metal pad is exposed.

24. A method according to claim 23 wherein removing the second portion of the under bump metallurgy layer comprises etching the second portion of the under bump metallurgy layer using an etch chemistry that etches at least a portion of the under bump metallurgy layer preferentially with respect to the conductive barrier layer and the metal pad.

25. A method according to claim 18 wherein forming the under bump metallurgy layer comprises, before forming the conductive barrier layer, forming the under bump metallurgy layer on the metal pad and on the insulating layer, and
   after forming the conductive barrier layer, removing portions of the under bump metallurgy layer that are free of the conductive barrier layer.

26. A method according to claim 18 wherein forming the conductive barrier layer comprises selectively forming the conductive barrier layer on a portion of the under bump metallurgy layer on a first portion of the metal pad so that a second portion of the under bump metallurgy layer on a second portion of the metal pad is free of the conductive barrier layer, the method further comprising:
   after selectively forming the conductive barrier layer, removing the second portion of the under bump metallurgy layer from the second portion of the metal pad so that the second portion of the metal pad is exposed.

27. A method according to claim 26 wherein removing the second portion of the under bump metallurgy layer comprises etching the second portion of the under bump metallurgy layer using an etch chemistry that etches at least a portion of the under bump metallurgy layer preferentially with respect to the conductive barrier layer and the metal pad.

28. A method according to claim 18 wherein a center of the conductive barrier layer is substantially offset with respect to a center of the metal pad.

29. A method according to claim 18 further comprising:
   providing a second metal pad on the substrate, wherein the first and second metal pads are spaced apart; and
   forming a second conductive barrier layer on a portion of the second metal pad, wherein an alignment of the first conductive barrier layer relative to the first metal pad is different than an alignment of the second conductive barrier layer relative to the second metal pad.

30. A method according to claim 29 wherein the first conductive barrier layer is substantially aligned relative to the first metal pad and wherein the second conductive barrier layer is substantially offset relative to the second metal pad.

31. A method according to claim 29 wherein the first conductive barrier layer is substantially offset in a first direction relative to the first metal pad and wherein the second conductive barrier layer is substantially offset in a second direction relative to the second metal pad and wherein the first and second directions are different.

* * * * *